United States Patent
Kuranaga et al.

(10) Patent No.: US 9,525,154 B2
(45) Date of Patent: Dec. 20, 2016

(54) DISPLAY DEVICE

(71) Applicant: Japan Display Inc., Tokyo (JP)

(72) Inventors: Takahide Kuranaga, Tokyo (JP); Toshihiko Itoga, Tokyo (JP); Norio Oku, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/574,735

(22) Filed: Dec. 18, 2014

(65) Prior Publication Data

US 2015/0189717 A1   Jul. 2, 2015

(30) Foreign Application Priority Data

Dec. 27, 2013   (JP) ................................. 2013-273575

(51) Int. Cl.
   *H01L 51/52*   (2006.01)

(52) U.S. Cl.
   CPC ......... *H01L 51/5246* (2013.01); *H01L 51/525* (2013.01); *H01L 2251/5338* (2013.01); *H01L 2251/566* (2013.01)

(58) Field of Classification Search
   CPC ......... H05B 33/04; H05B 33/10; H05B 33/12; H01L 51/5237; H01L 51/50; H01L 51/5246; H01L 51/0097; H01L 51/524
   USPC .......................................... 313/498–512, 292
   See application file for complete search history.

(56) References Cited

U.S. PATENT DOCUMENTS

| | | | |
|---|---|---|---|
| 2004/0061437 A1* | 4/2004 | Ikagawa | H01L 51/5237 313/506 |
| 2005/0189878 A1* | 9/2005 | Shitagami et al. | 313/512 |
| 2006/0091796 A1* | 5/2006 | Shirogane | H01L 27/3239 313/506 |
| 2006/0158108 A1* | 7/2006 | Hayashi | 313/506 |
| 2007/0096631 A1* | 5/2007 | Sung | G02F 1/1339 313/498 |
| 2008/0124541 A1* | 5/2008 | Peter | H05B 33/04 428/332 |
| 2009/0039780 A1* | 2/2009 | Kim | H01L 51/5237 313/512 |
| 2009/0115325 A1* | 5/2009 | Matsuzaki et al. | 313/504 |
| 2009/0128021 A1* | 5/2009 | Ishii | H01L 51/5237 313/504 |
| 2009/0128030 A1* | 5/2009 | Kai | H01L 51/5237 313/512 |
| 2009/0134786 A1* | 5/2009 | Matsuzaki et al. | 313/504 |
| 2009/0200924 A1* | 8/2009 | Matsuzaki et al. | 313/504 |
| 2013/0300284 A1* | 11/2013 | Nishido | 313/511 |

FOREIGN PATENT DOCUMENTS

JP   2009-231192 A   10/2009
JP   2011-113808 A    6/2011

* cited by examiner

*Primary Examiner* — Donald Raleigh
*Assistant Examiner* — Kevin Quarterman
(74) *Attorney, Agent, or Firm* — Typha IP LLC

(57) ABSTRACT

A display device includes a first substrate having flexibility, a second substrate having flexibility arranged facing the first substrate, a light emitting element arranged in a display region of the first substrate, and a filling material covering the light emitting element and extending from the display region to an end part of the first substrate and the second substrate. The filling material is a solid and is provided on the inner side from the first substrate and second substrate.

9 Claims, 25 Drawing Sheets

DISPLAY DEVICE

CROSS REFERENCE TO RELATED APPLICATIONS

This application is based upon and claims the benefit of priority from the prior Japanese Patent Application No. 2013-273575, filed on Dec. 27, 2013, the entire contents of which are incorporated herein by reference.

FIELD

The present invention is related to a display device, a display device formation substrate and a method of manufacturing the display device, and the disclosed embodiments are related to a sealing structure of a pixel.

BACKGROUND

In recent years, in a light emitting display device for mobile purposes, there is a strong demand for high resolution and low power consumption. Display devices which use a liquid crystal display device (LCD) or organic light-emitting diode (OLED) such an organic EL display device or electronic paper etc are being adopted as display devices for mobile purposes.

Among these, an organic EL display device or electronic paper do not require a back light or polarizing plate which were necessary in liquid crystal devices. Furthermore, since the drive voltage of a light emitting element is low, these devices are attracting a great deal of attention as low power consumption and thin light emitting display device. In addition, since it is possible to form a display device just with a thin film, it is possible to realize a display device capable of bending (flexible). Furthermore, since these display devices do not use a glass substrate, they are attracting a great deal of attention as display devices which are light and difficult to break.

A light emitting element such as an organic EL element arranged in each pixel of an organic EL display device is known to have a light emitting efficiency which drops due to degradation when exposed to oxygen or a water component. In order to solve this problem, a technology for forming a seal member so as to completely enclose the periphery of a light emitting element and fill a resin material as a filling material into a region enclosed by two opposing substrates and the seal member thereby controlling oxygen and a water component from entering from the exterior is disclosed in Japanese Laid Open Patent 2011-113808 for example.

In addition, a flexible substrate is used in a flexible display device. Although it is possible to use a very thin film of about 10 um as the flexible substrate, a stand-alone thin film flexible substrate warps due to internal stress.

When the flexible substrate in the structure shown in Japanese Laid Open Patent 2011-113808 is used, each opposing substrate is not fixed further to the exterior than a seal member. Therefore, warping occurs further to the exterior than a seal member in each opposing substrate due to internal stress. A problem wherein a substrate and a seal member peel occurs when force in the direction where the substrate and the seal member are peeled continues to operate on an end part of the seal member due to this warping. When the substrate and the seal member peel away from each other, not only is there a loss in a clean look appearance, the stopping ability drops with respect to oxygen or water component from the exterior which causes degradation of a light emitting element. As a result, there is a drop in reliability of the display device. In addition, when a peeling state becomes even worse, the substrate and the seal member become completely peeled from each other the image display itself of a display device may be badly affected.

In addition, the display device shown in Japanese Laid Open Patent 2011-113808 has a structure in which a seal member and filling material are formed for each display device. When a dip method or inkjet method is used for forming a seal member, this requires not only time for forming a seal member pattern but time is also necessary for obtaining alignment with respect to a substrate formed with the seal member. That is, in a structure where the seal member and substrate are formed in each display device respectively, productivity becomes poor and leads to problems such as lengthening of the manufacturing process and an increase in manufacturing costs.

SUMMARY

A display device according to one embodiment of the present invention includes a first substrate having flexibility, a second substrate having flexibility arranged facing the first substrate. a light emitting element arranged in a display region of the first substrate, and a filling material covering the light emitting element and extending from the display region to an end part of the first substrate and the second substrate.

In addition, in another aspect, the filling material may be a solid.

In addition, in another aspect, an end part of the filling material may be positioned between the first substrate and second substrate, and a first seal member.

In addition, in another aspect, the first seal member may be included extending from a first side of the first substrate to a second side facing the first side between the display region and a terminal region exposing the first substrate from the second substrate and connecting an external terminal.

In addition, in another aspect, a spacer may be arranged on at least one side different to a side arranged with the first seal member with respect to the display region.

In addition, in another aspect, the spacer may be further included arranged in a region facing the first seal member via the display region.

In addition, in another aspect, the spacer may be a second seal member.

In addition, in another aspect, a slit may be arranged in the second seal member.

A display device according to one embodiment of the present invention includes a first substrate having flexibility, a second substrate having flexibility arranged facing the first substrate, a light emitting element arranged in a display region of the first substrate, and a fixing part for fixing an end part of the first substrate and the second substrate.

In addition, in another aspect, an end part of a filling material is present at roughly the same position as an end part of the first substrate and second substrate or further to the interior than the end part of the first substrate and second substrate.

In addition, in another aspect, a first seal member may be further included extending from (a first side) one side of the first substrate to (a second side) another side facing the one side between the display region and a terminal region positioned in a periphery of the display region and connecting an external element.

In addition, in another aspect, a spacer may be arranged on at least one side different to a side arranged with the first seal member with respect to the display region.

In addition, in another aspect, a spacer may be further included arranged in a region facing the first seal member via the display region.

In addition, in another aspect, the spacer may be a second seal member.

In addition, in another aspect, a slit may be arranged in the second seal member.

A display device formation substrate according to one embodiment of the present invention includes a substrate arranged with a plurality of panels, one panel of the plurality of panels including a first substrate a second substrate arranged facing the first substrate, a light emitting element arranged in a display region of the first substrate, a seal member positioned between the display region of the plurality of panels and a terminal region of the plurality of panels positioned on a periphery of the display region and connected to an external terminal, and a filling material arranged in a region enclosed by the seal member and arranged common to the plurality of panels.

In addition, in another aspect, each of the terminal regions of adjacent panels may be arranged in mutually facing regions via the seal member.

In addition, in another aspect, the seal member may be arranged in a region facing the terminal region via the display region in each of the plurality of panels.

A method of manufacturing a display device according to one embodiment of the present invention includes preparing a first substrate, forming a light emitting element in a plurality of display regions of the first substrate, forming a seal member so as to pass between the plurality of display regions and a plurality of terminal regions positioned on each periphery of the plurality of display regions and connected to an external terminal, forming a filling material in a region enclosed by the seal member and common to the plurality of display regions, bonding together the first substrate with a second substrate so as to face the plurality of display regions, and separating the first substrate and the second substrate between adjacent display regions into panels.

In addition, in another aspect, the first substrate and the second substrate may have flexibility In addition, in another aspect, each of the terminal regions of adjacent panels may be arranged in mutually facing regions via the seal member.

In addition, in another aspect, the seal member may be arranged in a region facing the terminal region via the display region in each of the panels.

DESCRIPTION OF EMBODIMENTS

Figure 1:
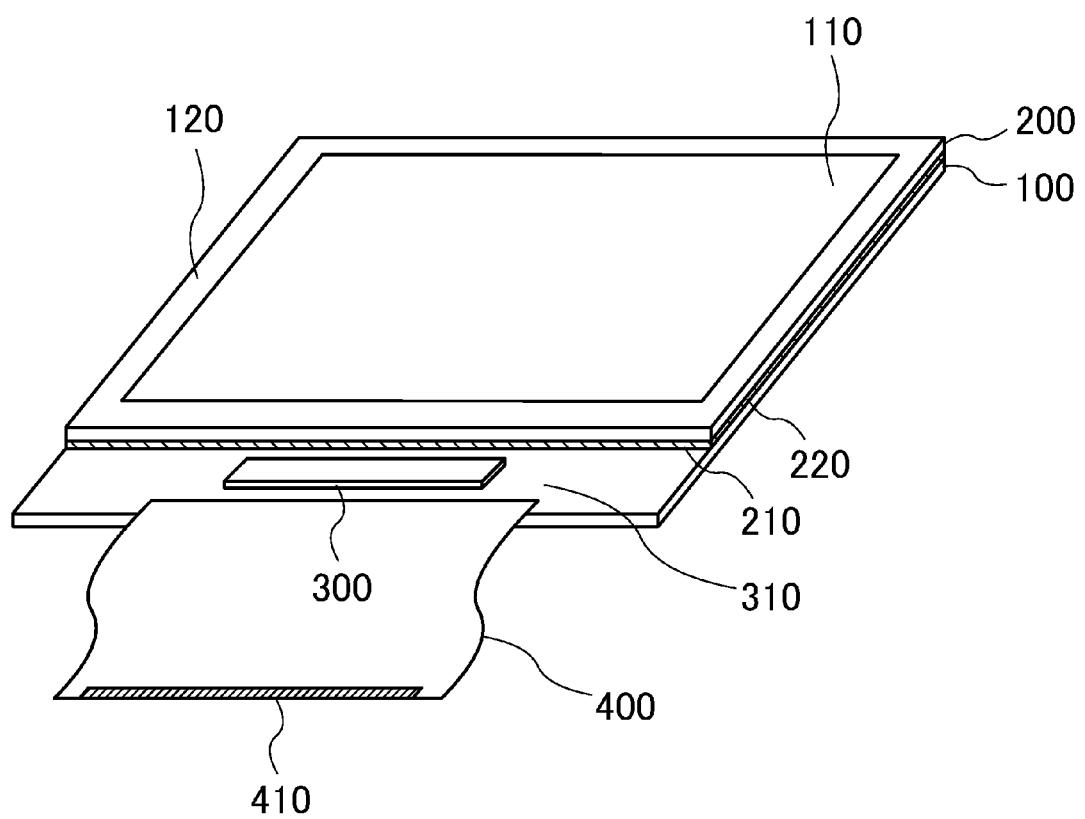
FIG. 1 is a diagram showing a perspective view of a display device in embodiment one of the present invention.

Each embodiment of the present invention is explained below while referring to the drawings. Furthermore, the disclosure is merely one example and various modifications which conform with the premise of the invention and which could be easily conceived of by person ordinarily skilled in the art are included within the scope of the present invention. In addition, in order to further clarify explanation, the drawings may be expressed schematically with respect to the width, thickness and shape of each part compared to actual appearance and are only examples and do not limit the interpretation of the present invention. In addition, in the specification and each drawing the same reference symbols are attached to the same elements that have previously been described or already exist in previous drawings and therefore a detailed explanation is sometimes omitted where appropriate.

(Embodiment One)

Figure 2:
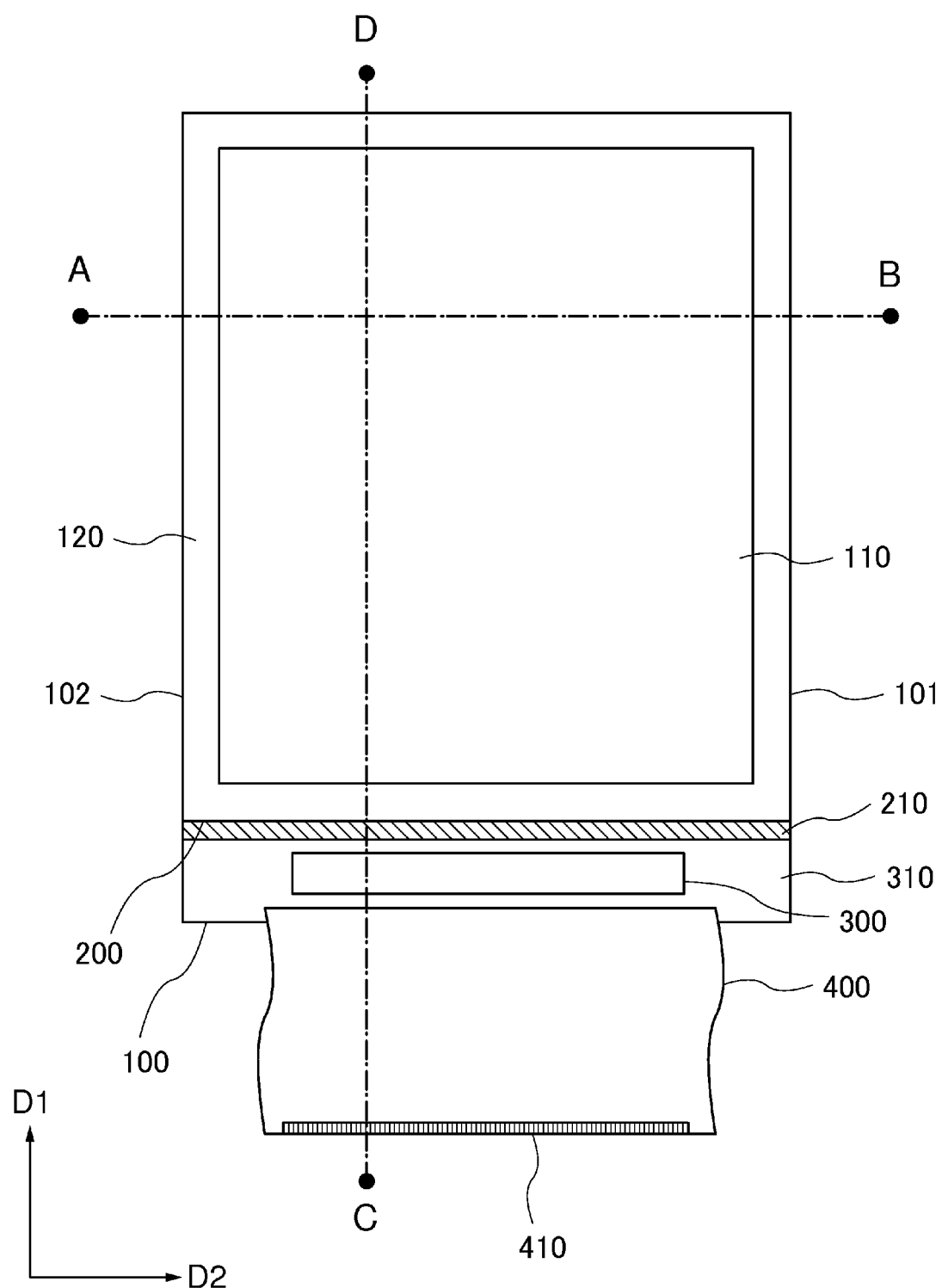
FIG. 2 is a diagram showing a planar view of the display device in embodiment one of the present invention.
Figure 3:
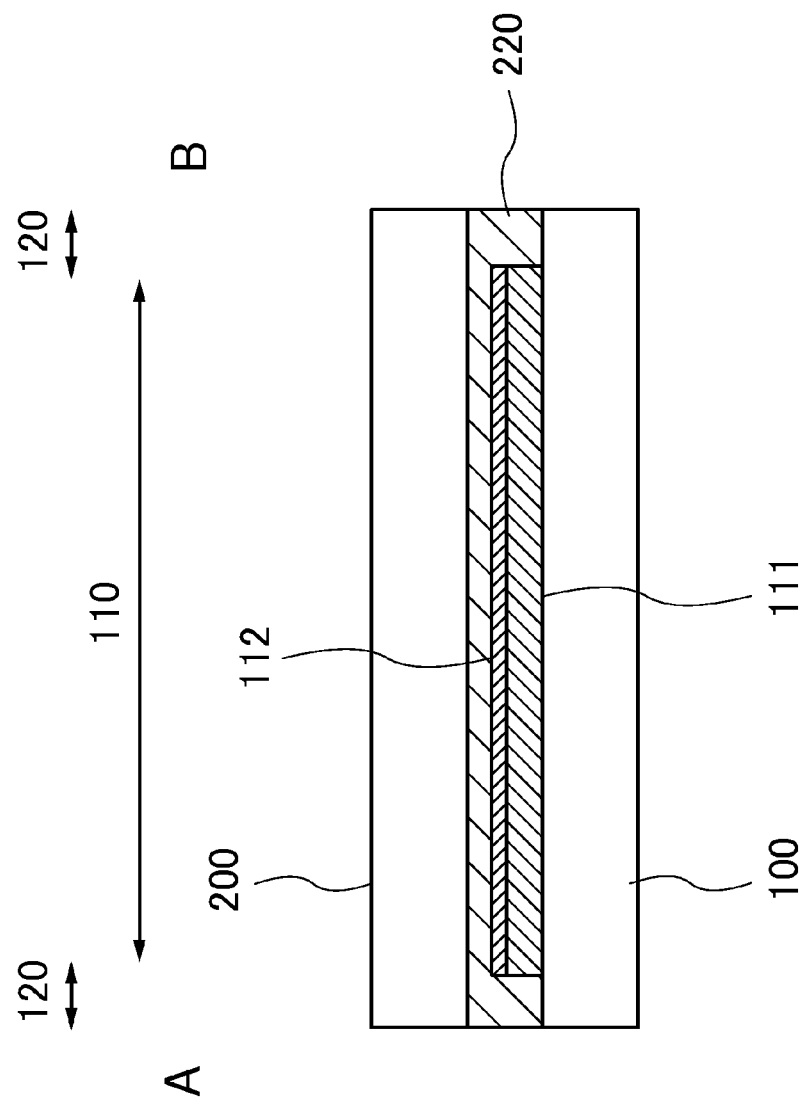
FIG. 3 is a diagram showing a cross-sectional view along the line A-B of the display device in embodiment one of the present invention.
Figure 4:
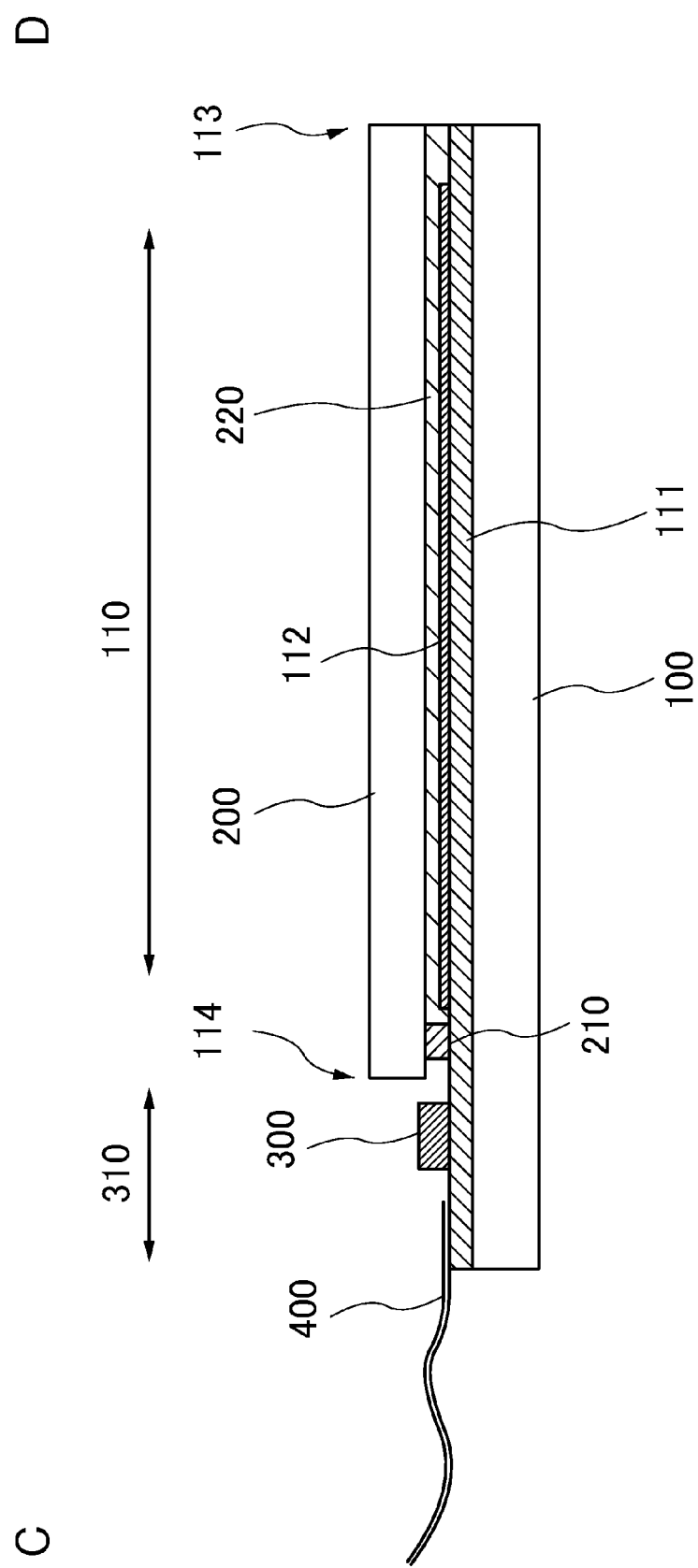
FIG. 4 is a diagram showing a cross-sectional view along the line C-D of the display device in embodiment one of the present invention.

The structure of the display device related to embodiment one of the present invention is explained using FIG. 1 to FIG. 4. FIG. 1 is a diagram showing a perspective view of the display device in embodiment one of the present invention. In addition, FIG. 2 is a diagram showing a planar view of the display device in embodiment one of the present invention. FIG. 3 is a diagram showing a cross-sectional view of the line A-B in the display device in embodiment one of the present invention. FIG. 4 is a diagram showing a cross-sectional view of the line C-D in the display device in embodiment one of the present invention.

As is shown in FIG. 1 and FIG. 2, the display device shown in embodiment one includes a substrate 100 having flexibility with a plurality of pixels arranged in a matrix shape and including a light emitting element, an opposing substrate 200 having flexibility arranged facing the substrate 100, and external elements such as driver IC 300 and FPC 400 connected to a terminal region 310 in which the substrate 100 is exposed from the opposing substrate 200. The substrate 100 is divided into a display region 110 and a periphery region 120 positioned on the periphery of the display region 110. The plurality of pixels including a light emitting element is arranged in a matrix shape in the display region 110. A drive circuit driving each pixel arranged in the display region 110 and receiving a signal from an external element such as the driver IC 300 and FPC 400 is arranged in the periphery region 120.

In addition, a seal member 210 and a filling material 220 are arranged between the substrate 100 and opposing substrate 200. As is shown in FIG. 2, the seal member 210 extends as far a second side 102 facing a first side 101 via the display region 110 from the first side 101 of the substrate 100 between the display region 110 and terminal region 310. In other words, the seal member 210 is arranged so as to separate the display region 110 and terminal region 310 and the filling material 220 is arranged on the side of the display region 110 of the seal member 210.

Here, although not shown in FIG. 2, as can be seen by referring to FIG. 1 and FIG. 3, the filling material 220 is arranged in the display region 110 and the periphery region 120. In addition, in other words, the filling material 220 is arranged so as to cover the display region 110 and periphery region 120. In addition, in other words, the filling material 220 is dammed by the seal member 210 which is arranged between the display region 110, periphery region 120 and terminal region 310. Here, it is preferred that a solid filling material is used for the filling material 220. A terminal part 410 connected to a controller circuit which controls a drive circuit is arranged in FPC 400.

Next, the cross-sectional structure of the line A-B in FIG. 2 is explained using FIG. 3. As is shown in FIG. 3, a transistor layer 111 is arranged above the substrate 100 and a light emitting element 112 is arranged above the transistor layer 111. The transistor layer 111 and light emitting element 112 are covered by the filling material 220. The filling material 220 extends from the display region 110 up to the end part of the substrate 100 and opposing substrate 200. The filling material 200 at the end part of the substrate 100 and opposing substrate 200 functions as a fixing part which fixes both substrates.

In addition, the end part of the filling material 220 is positioned roughly the same as the end part of the substrate 100 and opposing substrate 200 or is located further inwards than the end part of the substrate 100 and opposing substrate 200. In other words, the filling material 220 is not formed on the side surface of the substrate 100 and opposing substrate 220. However, a structure in which the filling material 220 sticks out slightly from the end part of the substrate 100 and opposing substrate 200 is not excluded. That is, as long as it is within the range of achieving the goal of the present invention, the filling material 220 may stick out slightly from the end part of the substrate 100 and opposing substrate 200. In addition, the filling material 220 is preferred to include a function for adhering the substrate 100 and opposing substrate 200 together.

Next, the cross-sectional structure of the line C-D in FIG. 2 is explained using FIG. 4. As is shown in FIG. 4, a first end part 113 of the substrate 100 and opposing substrate 200 is similar to the end part of the substrate 100 and opposing substrate 200 shown in FIG. 3 in that the filling material 220 extends as far as the end part of the substrate 100 and opposing substrate 200. However, a second end part 114 of the opposing substrate 200 is different to the first end part 113 in that the filling material 220 is not located as far as the end part of the opposing substrate 200 and the seal member 210 is arranged in the vicinity of the second end part 114. Although explained in FIG. 2, the seal member 210 is arranged between the display region 110 and terminal region 310 and is arranged so as to dam the filling material 220.

Here, although a structure in which the seal member 210 is formed to more to the inner side than the second end part of the opposing substrate 200 in FIG. 4 was explained, the present invention is not limited to this structure. The seal member 210 may be arranged on the second end part 114 of the opposing substrate 200 and may also be located further the outer side than the second end part 114 of the opposing substrate 210.

(Problems in a Conventional Example)

Figure 23:
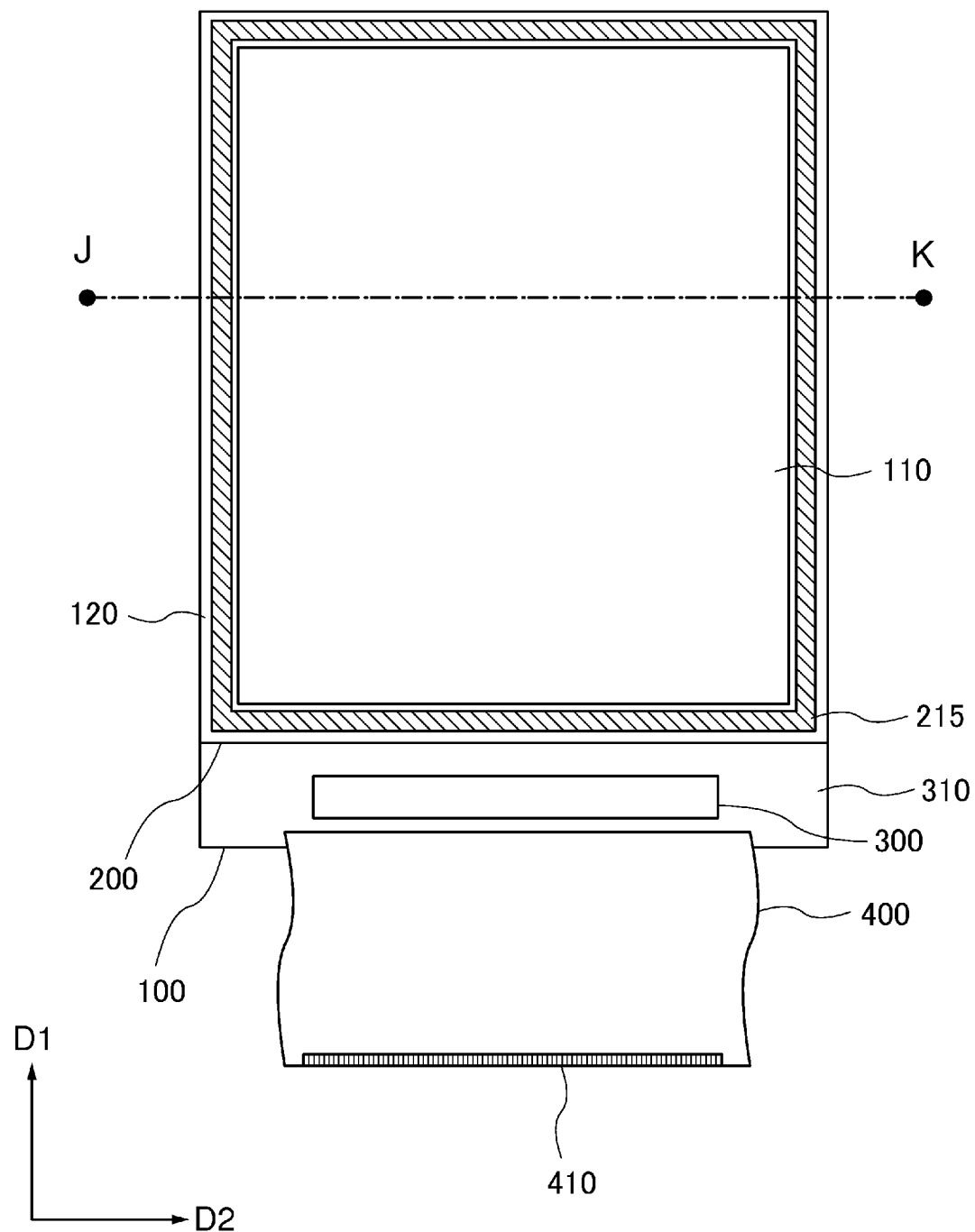
FIG. 23 is a diagram showing a planar view of a conventional display device.
Figure 24:
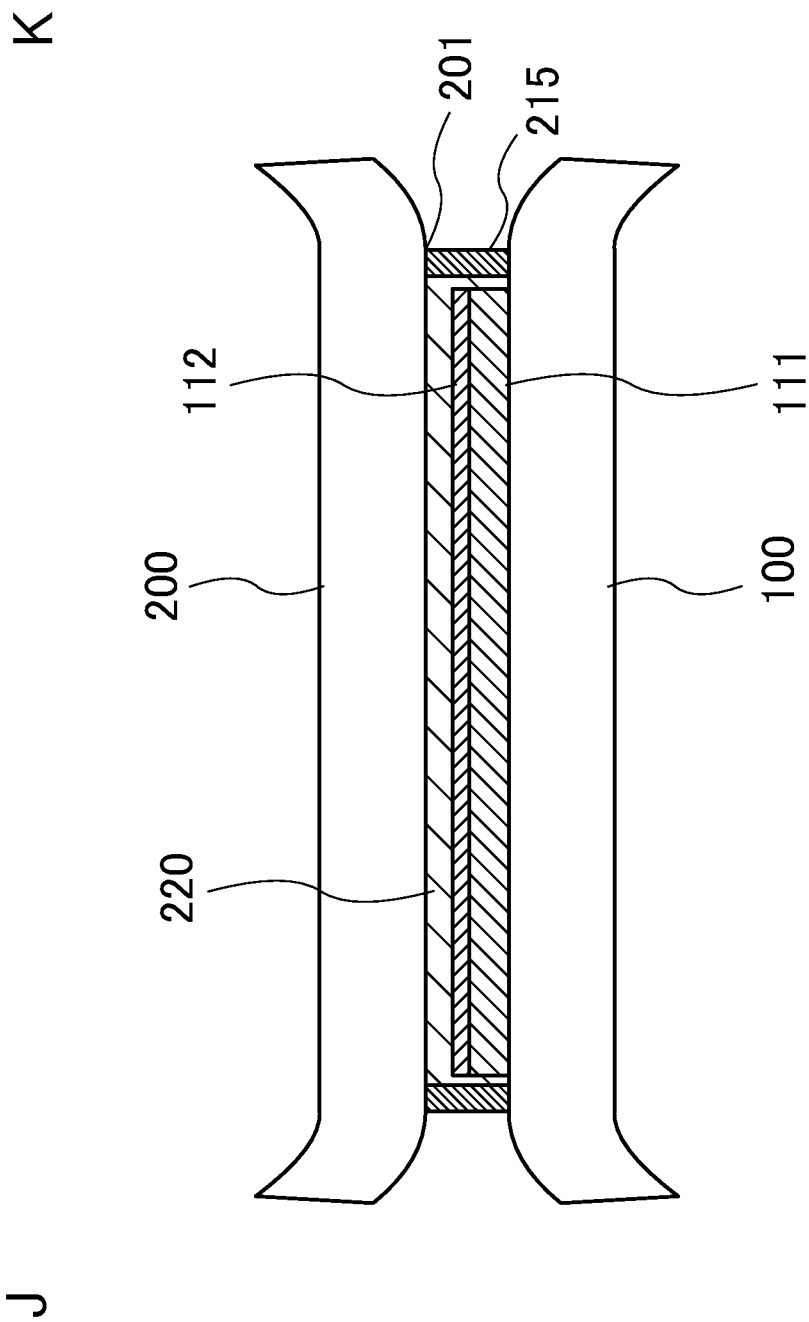
FIG. 24 is a diagram showing a cross-sectional view along the line J-K of a conventional display device.

Here, a conventional display device structure and problems associated with this structure are explained using FIG. 23 and FIG. 24. FIG. 23 is a diagram showing a planar view of a conventional display device. In addition, FIG. 24 is a diagram showing the cross-sectional line J-K of a conventional display device.

In FIG. 23, unlike FIG. 2, a seal member 215 is arranged to enclose the display region 110 and an offset is arranged between the substrate end part and seal member 215 and between the seal member 215 and the display region 110. These offsets are set giving consideration to the alignment accuracy of the device when forming the seal member 215. The offset between the substrate end part and the seal member 215 is arranged in order to prevent the seal member 215 from falling outside the substrate when coating the seal member 215. In addition, the offset between the seal member 215 and the display region 110 is arranged in order to prevent particle shaped spacers included in the seal member 215 from pressing the light emitting element. As a result, it is possible to prevent defects in emitting light.

As described above, it is necessary to set the width of the periphery region 120 while considering the line width of the seal member 215 and the alignment accuracy of a device coated with the seal member 215 and to ensure that the periphery region is narrow and the display region is wide, that is, to prevent what is called a [narrow frame].

In addition, the substrate 100 and opposing substrate 200 are not fixed in the offset region on the outer side of the seal member as shown in FIG. 24. It is easy for warping to occur due to internal stress in a flexible substrate used in a flexible display device. Therefore, as is shown in FIG. 24, the substrate 100 and opposing substrate 200 may sometimes warp in the offset region further to the outer side of the seal member.

As is shown in FIG. 24, when the substrate 100 and opposing substrate 200 warp, for example a force is applied on the fixing point 201 of the opposing substrate 200 and seal member 215 in the direction where the opposing substrate 200 and seal member 210 peel from each other. When the opposing substrate 200 and seal member 210 peel from each other due to the effects of this warping for example, the ability to block oxygen or water from entering from the outside decreases which leads to degradation of the light emitting element. In addition, if peeling becomes even worse, the opposing substrate 200 may peel away completely which badly affects the image display itself of the display device.

Compared with a conventional example, in the display device including the characteristics shown in embodiment one, it is sufficient that the seal member 210 be located between at least the display region 110 and terminal region 310. That is, for example, by forming a structure in which the seal member is not arranged in a part where the width of the periphery region is to be made narrow as in the region near the first side 101 and second side 102, it is possible to realize a narrow frame.

In addition, it is possible to fix the end part of both substrates by extending the filling material 220 from the display region 110 up to the end part of the substrate 100 and opposing substrate 200. As a result, it is possible to control warping of the substrate 100 and opposing substrate 200 and control the peeling problem of the substrate and seal member.

In addition, even if the seal member 220 is located further to the inner side than the end part of the substrate 100 and the opposing substrate 200 but is not located on the side surface of the substrate 100 and opposing substrate 200, it is possible to form the width of the end part of the substrate 100 and opposing substrate 200 from the end part of the filling material 220 (that is, width of the offset region to the outer side of the filling material 220) more narrow than the width of the offset region to the outer side of the seal member shown in FIG. 23 and FIG. 24. This is because the viscosity of the filling material before curing is lower than that of the seal member. Consequently, it is possible to control warping of the substrate 100 and opposing substrate 200 even if the filling material 220 is located further to the inner side than the end part of the substrate 100 and opposing substrate 200 or located on a side surface of the substrate 100 and opposing substrate 200.

Furthermore, in the conventional structure shown in FIG. 23 and FIG. 24, although a technology is known wherein warping of a substrate is controlled by reinforcement by coating a resin from the side surface of the bonded substrate, it is difficult to coat a resin from the side surface of a flexible substrate in the case where a very thin flexible substrate in the order or 10 um is used. As is shown in embodiment one, in a structure in which the filling material 200 is located further on the inner side than the end part of the substrate 100 and opposing substrate 200 and is not located on the side surface of the substrate 100 and opposing substrate 200, even if a process for coating a resin from the side surface of a substrate is not used, it is possible to control warping of the substrate 100 or opposing substrate 200.

Figure 5:
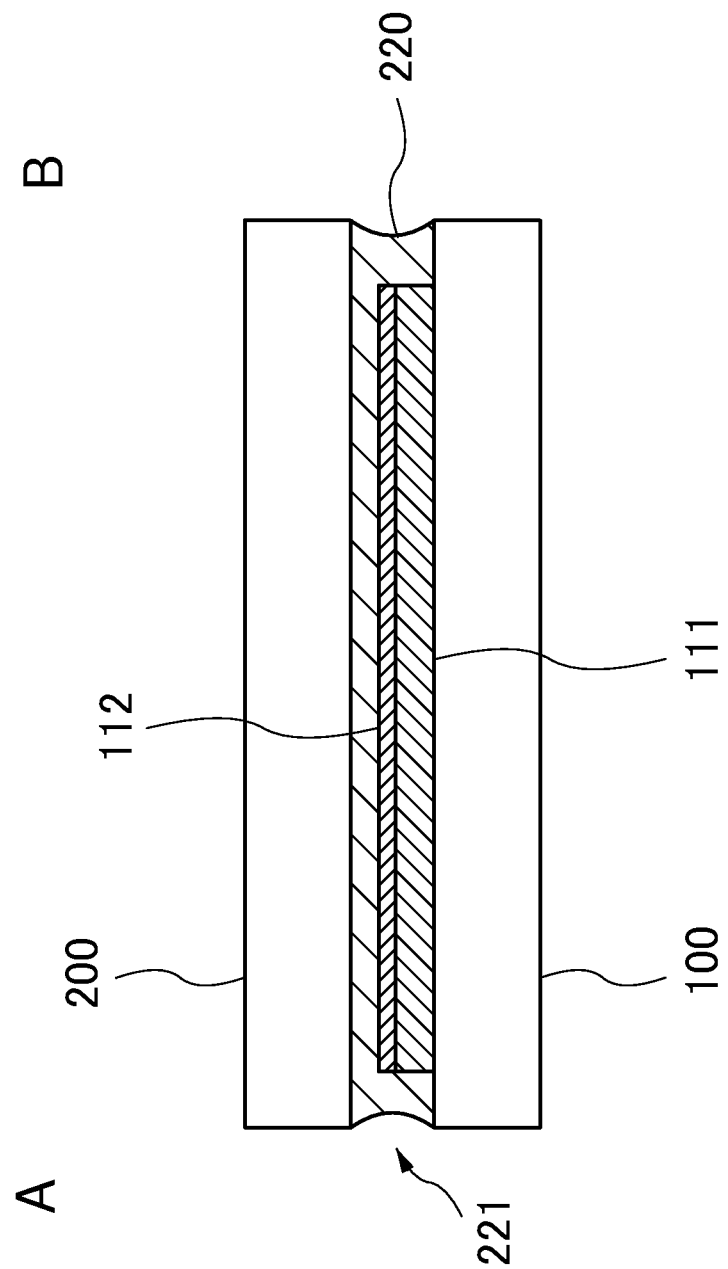
FIG. 5 is a diagram showing a cross-sectional view of the line A-B of the display device in a modified example 1 of embodiment one of the present invention.

Next, a modified example of embodiment one is explained using FIG. 5 to FIG. 11. FIG. 5 is a diagram showing a cross-section of the line A-B of the display device in a modified example one of embodiment one of the present invention. Although FIG. 5 is similar to FIG. 3, it is different to FIG. 3 in that a recessed part 221 is arranged where the end part of the filling material 220 is recessed to the inner site. However, in the example in FIG. 5, the filling material 220 also extends from the display region 110 up to the end part of substrate 100 and opposing substrate 200 and the same effects as in embodiment one shown in FIG. 3 can also be obtained.

Figure 6:
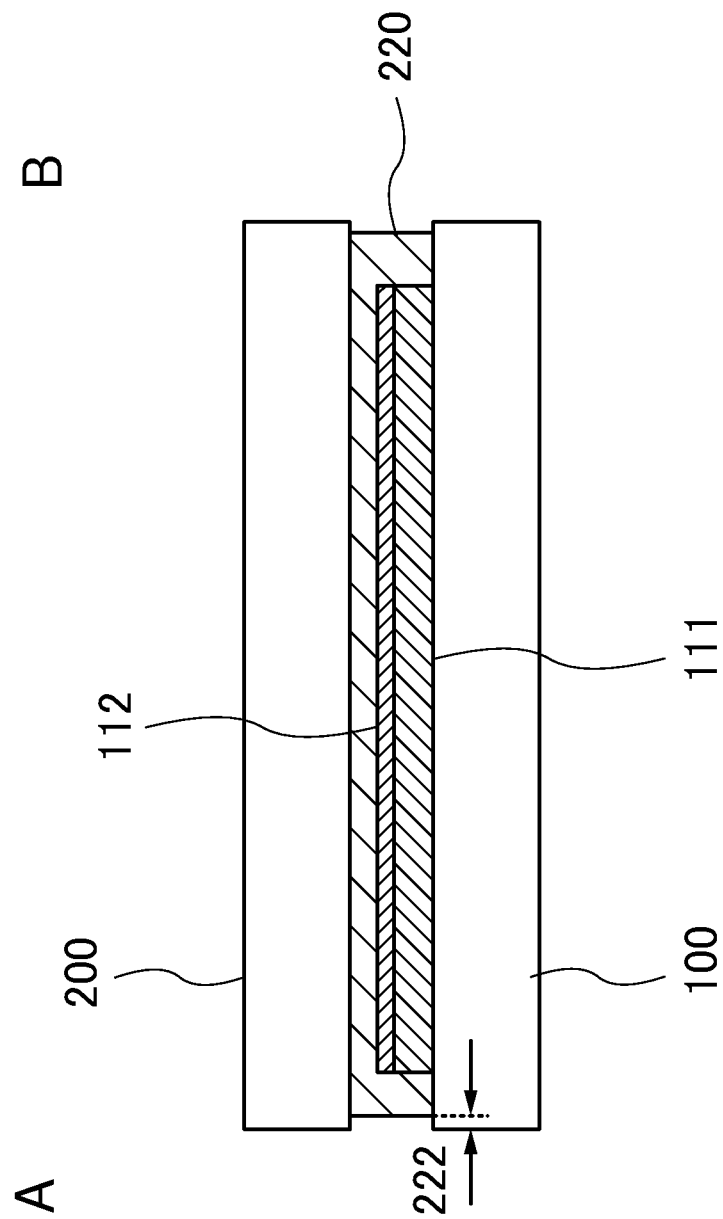
FIG. 6 is a diagram showing a cross-sectional view of the line A-B of the display device in a modified example 2 of embodiment one of the present invention.

FIG. 6 is a diagram showing a cross-section of the line A-B of the display device in a modified example two of embodiment one of the present invention. Although FIG. 6 is similar to FIG. 3, it is different in that the end part of filling material 200 does not extend as far as the end part of the substrate 100 and opposing substrate 200. Even in the structure shown in FIG. 6, if the filling material 200 includes a function of a fixing part which fixes the end part of the substrate 100 and opposing substrate 200, the same effects as embodiment one shown in FIG. 3 can be obtained.

Specifically, it is preferred that the distance 222 between the end part of the filling material 220 and substrate 100 or the end part of the opposing substrate 200 be 100 times or less the thickness of the substrate 100 or the opposing substrate 200. More preferably, the distance 222 should be 20 times or less than the thickness of the substrate 100 or opposing substrate 200. Even more preferably, the distance 222 should be 5 times or less than the thickness of the substrate 100 or opposing substrate 200.

Figure 7:
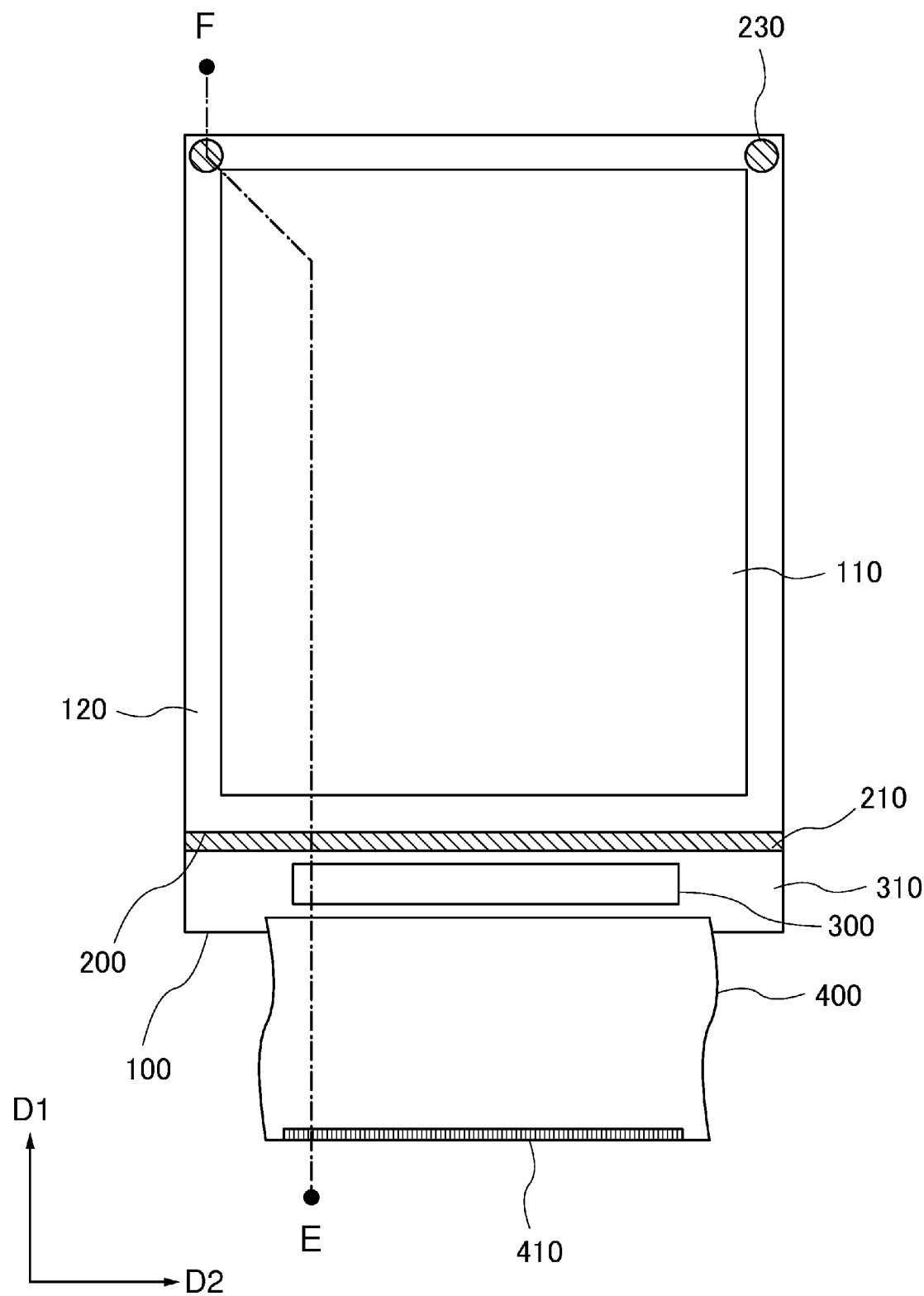
FIG. 7 is a diagram showing a planar view of the display device in a modified example 3 f embodiment one of the present invention.
Figure 8:
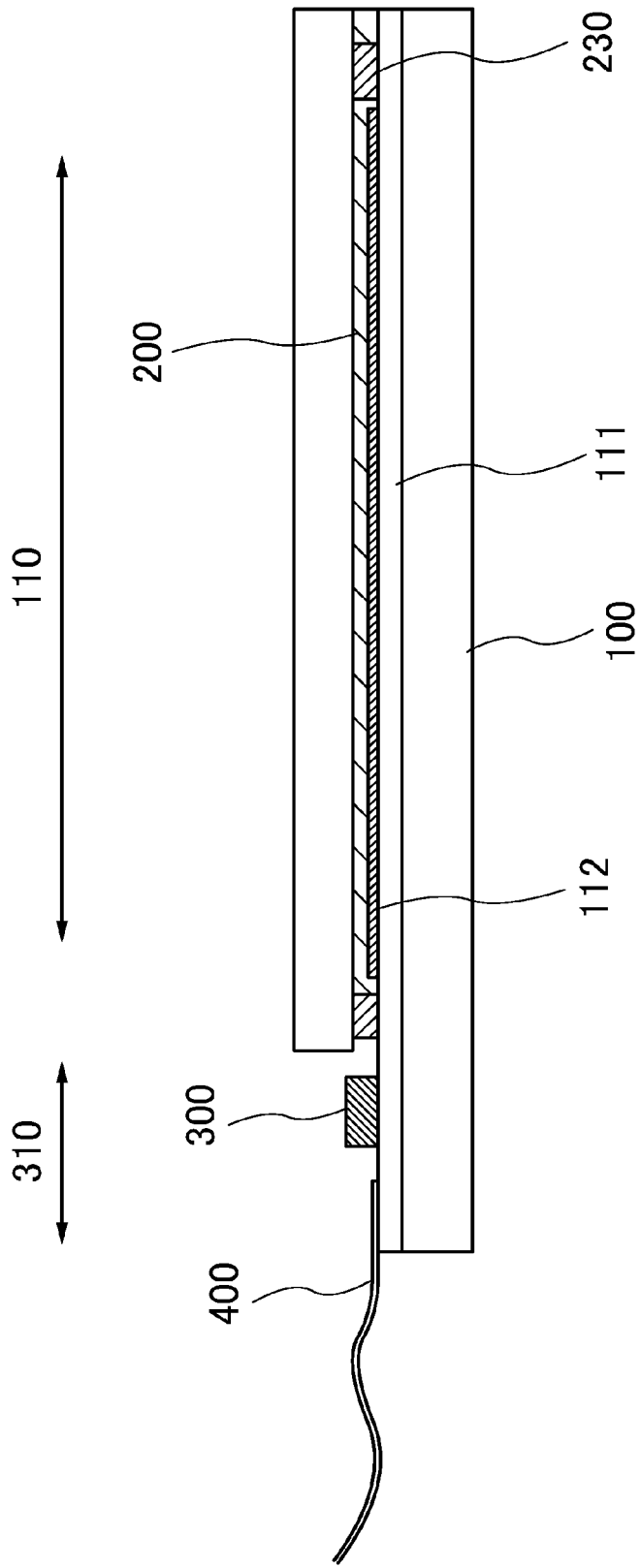
FIG. 8 is a diagram showing a cross-sectional view of the line E-F of the display device in the modified example 3 of embodiment one of the present invention.

FIG. 7 is a diagram showing a planar view of the display device in a modified example three of embodiment one of the present invention. In addition, FIG. 8 is a diagram showing a cross-section of the line E-F in the display device in a modified example three of embodiment one of the present invention. Although FIG. 7 and FIG. 8 are similar to FIG. 2 and FIG. 4, they are different to FIG. 2 in that at least one spacer 230 is arranged on a different side to the side on which the seal member 210 is arranged with respect to the display region 110. In particular, in FIG. 7, the spacer 230 is arranged on a side opposite the side on which the seal member 210 is arranged with respect to the display region 110. In other words, in FIG. 7, the spacer 230 is arranged in a region opposing the seal member 210 via the display region 110.

In FIG. 7 and FIG. 8, the spacer 230 is formed from the same material and by the same process as the seal member 210. That is, the spacer 230 also functions as a seal member. In addition, in FIG. 7 and FIG. 8, although the spacer 230 is shown having a structure whereby it is formed from the same material and by the same process as the seal member 210, the spacer 230 may also be formed from a different material and by a different process from the seal member 210. For example, the spacer 230 may be formed by stacking all or a part of the layers which forms the transistor layer 111 and light emitting element 112. In addition, the spacer 230 may also be formed by forming a resin layer, an inorganic layer or particles different to that of the seal component.

As described above, it is possible to more stable and more consistently support the distance between two opposing substrates by adopting a structure in which a spacer is arranged on at least one side different to the side on which a seal component is arranged with respect to a display region. In addition, because it is possible to reduce the amount of seal component used compared to a conventional structure, it is possible to obtain cost reduction effects.

Figure 9:
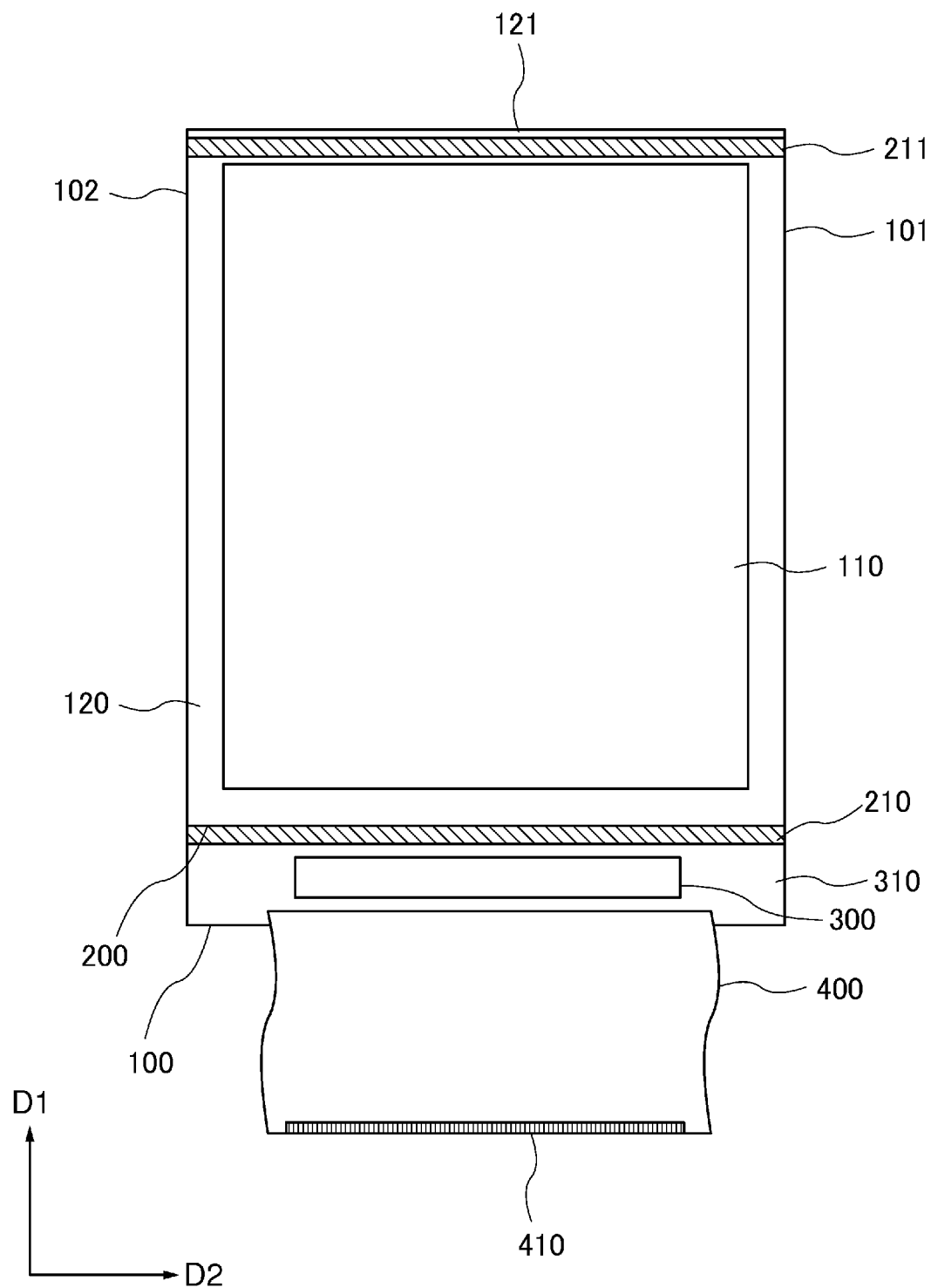
FIG. 9 is a diagram showing a planar view of the display device in a modified example 4 of embodiment one of the present invention.

FIG. 9 is a diagram showing a planar view of a display device of a modified example four of embodiment one of the present invention. Although FIG. 9 is similar to FIG. 7, it is different in that a seal member 211 is arranged on a side opposite to the side on which the seal member 210 is arranged with respect to the display region 110. In addition, in other words, in FIG. 9 the seal member 211 is arranged in a region facing the seal member 210 via the display region 110.

The seal member 211 extends to a second side 102 from a first side 101 of the substrate 100 in a region facing the terminal region 310 via the display region 110 in the periphery region 120. In FIG. 9, a filling material 220 is located in the periphery region 121 which is separated from the display region 110 by the seal member 211. However, if the filling material 220 is located up to the end part of the first side 101 and second 102 of the periphery region 120, then it is not absolutely necessary to locate a filling material up to the end part of the periphery region 121 and the filling material 220 does not have to be located in the periphery region 121.

In FIG. 9, because the seal member 211 also functions as a spacer, it is possible to uniformly set the distance between two opposing substrates similar to FIG. 7 using the structure shown in FIG. 9, and reduce the amount of seal member used compared to a conventional seal member. In addition, compared to the spacer 230 in FIG. 7, because the seal member 211 has a large contact area with the substrate 100 and opposing substrate 200, it is possible to more stably and uniformly support the distance between the substrates and strengthen the adhesion between the substrates.

Figure 10:
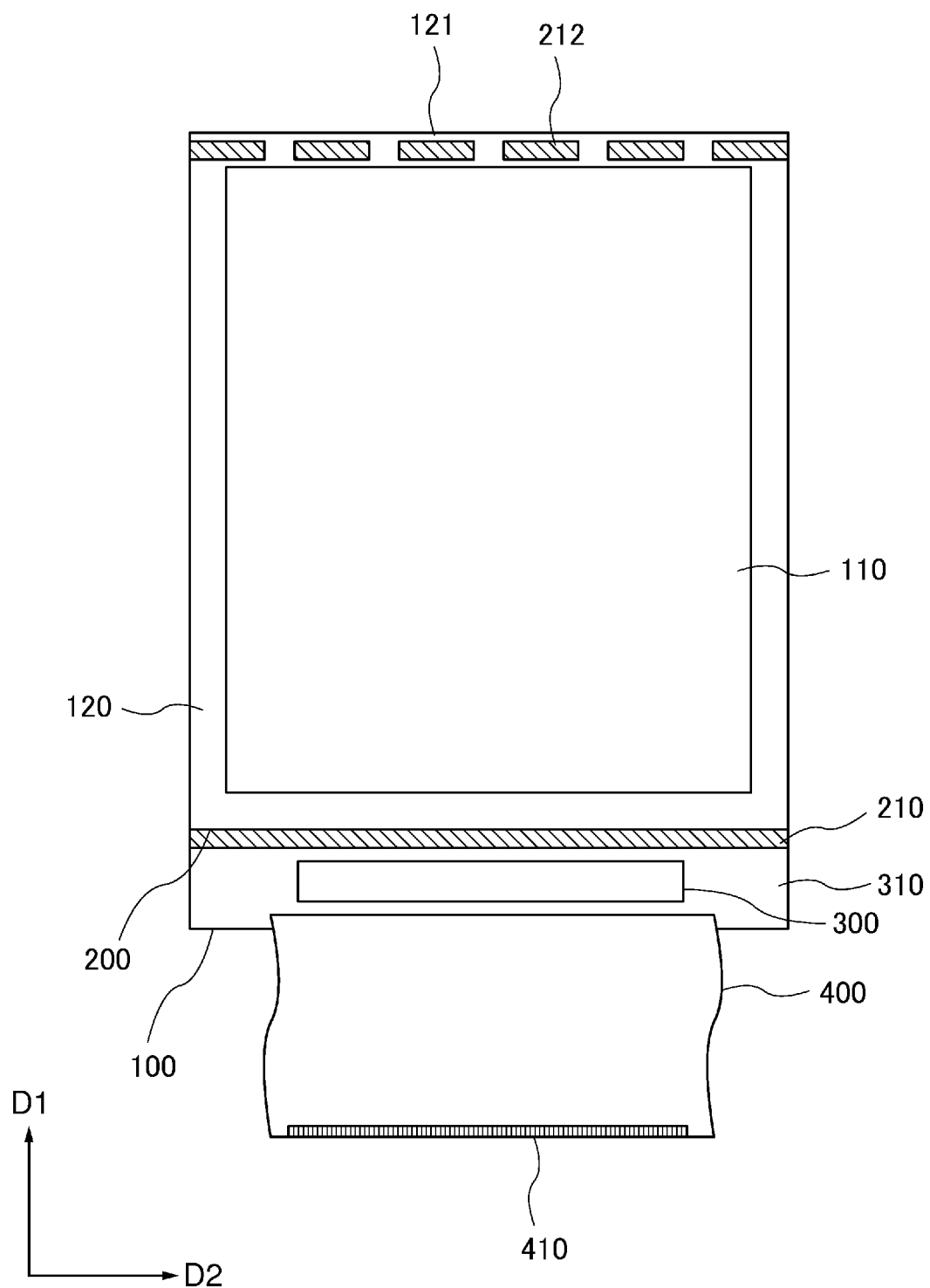
FIG. 10 is a diagram showing a planar view of the display device in a modified example 5 of embodiment one of the present invention.

FIG. 10 is a diagram showing a planar view of a display device in a modified example five of embodiment one of the present invention. Although FIG. 10 is similar to FIG. 9, it is different in that a slit is arranged in the seal member 212 in FIG. 10. In FIG. 10, although a plurality of slits is arranged in the seal member 212, it is sufficient that at least one slit is arranged. In addition, the seal member 212 may be arranged near the center in the direction D2 (left right direction) in FIG. 10 and a structure in which the seal member is not arranged on both sides is also possible.

Using the structure shown in FIG. 10, it is possible to stably and uniformly support the distance between two opposing substrates the same as in FIG. 9, and reduce the amount of seal member used compared to a conventional seal member. In addition, because the filling material of the periphery region 120 is connected to the filling material of the periphery region 121 via a slit, it is possible to improve adhesiveness of the filling material 220 of the periphery region 121.

Figure 11:
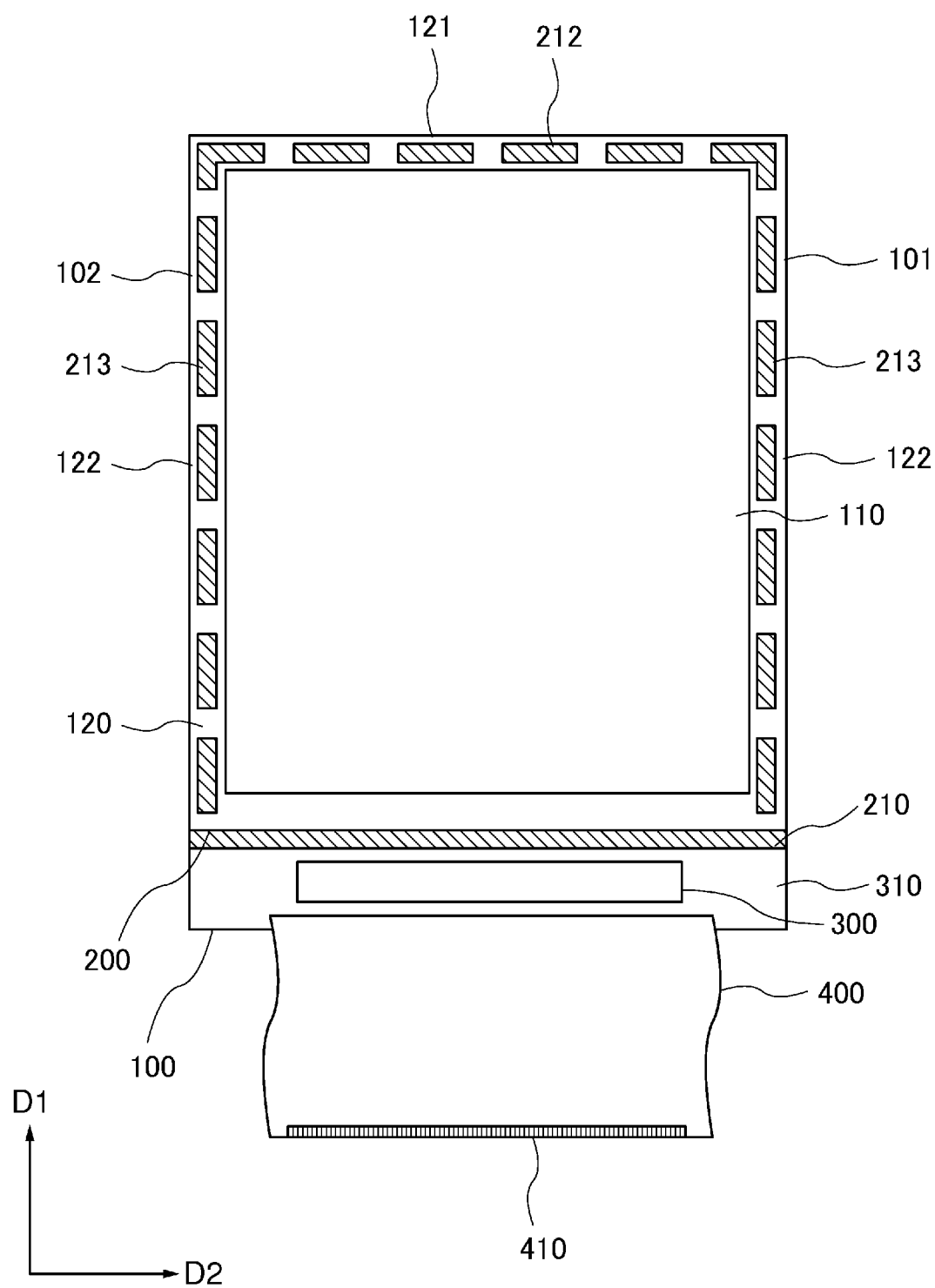
FIG. 11 is a diagram showing a planar view of the display device in a modified example 6 of embodiment one of the present invention.

FIG. 11 is a diagram showing a planar view of the display device in a modified example six of embodiment one of the present invention. Although FIG. 11 is similar to FIG. 10, it is different in that a seal member 213 is also arranged in the periphery region 120 adjacent to the first side 101 and second side 102. Although a plurality of slits is arranged in the seal member 213 in FIG. 11 the same as the seal member 212 in FIG. 10, it is sufficient that at least one slit is arranged. In addition, the seal member 213 may be arranged near the center in the direction D1 (vertical direction) in FIG. 11 and a structure in which the seal member is not arranged on both sides is also possible Using the structure shown in FIG. 11, it is possible to stably and uniformly support the distance between two opposing substrates the same as in FIG. 10, and reduce the amount of seal member used compared to a conventional seal member. In addition, because the filling material of the periphery region 120 is connected to the filling material of the periphery region 122 via a slit, it is possible to improve adhesiveness of the filling material 220 of the periphery region 122.

As described above, using the display device of embodiment one, it is possible to provide a display device with high reliability by controlling peeling between a substrate and seal member. In addition, it is possible to provide a display device with low manufacturing costs by reducing the amount of seal member used.

(Embodiment Two)

Figure 12:
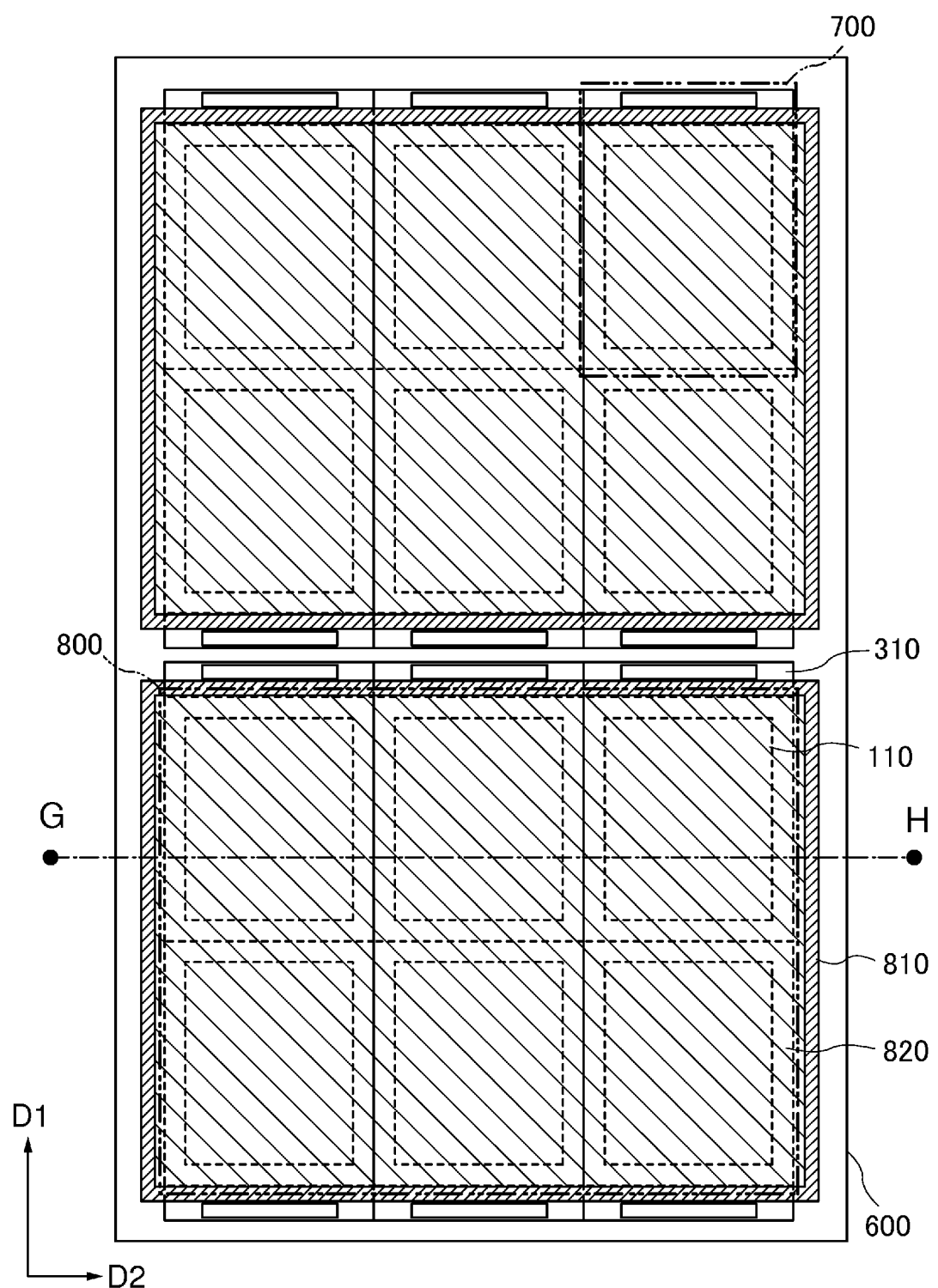
FIG. 12 is a diagram showing a planar view of a display device formation substrate embodiment two of the present invention.
Figure 13:
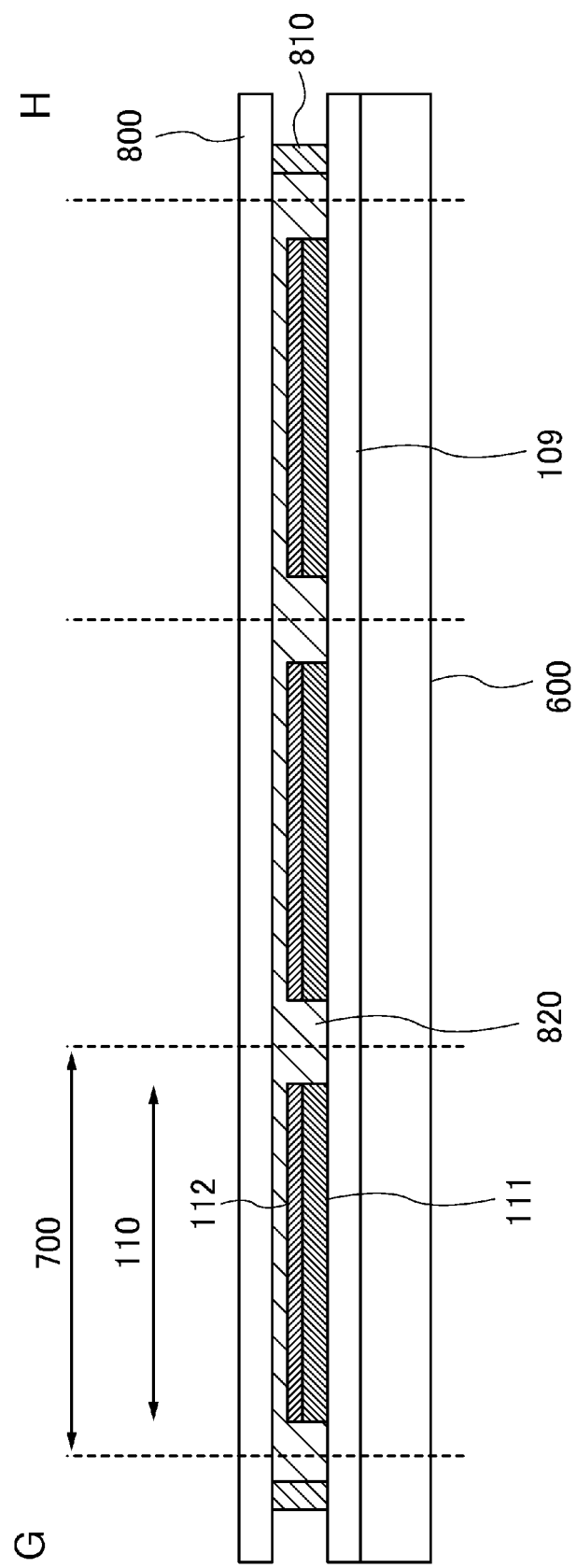
FIG. 13 is a diagram showing a cross-sectional view along the line G-H of the display device formation substrate in embodiment two of the present invention.

A structure of a display device formation substrate related to embodiment two of the present invention is explained using FIG. 12 and FIG. 13. Although a sealing structure of a one panel was explained in embodiment one, a display device formation substrate formed with a plurality of panels is explained in embodiment two. FIG. 12 is a diagram showing a planar view of a display device formation substrate in embodiment two of the present invention. In addition, FIG. 13 is a diagram showing a cross-sectional line G-H of the display device formation substrate in embodiment two of the present invention.

As is shown in FIG. 12 and FIG. 13, a plurality of panels 700 is arranged in the display device formation substrate of embodiment two. Here, a panel 700 includes a substrate 600, an opposing substrate 800 arranged facing the substrate 600, and a transistor layer 111 and light emitting element 112 arranged in the display region 110 of the substrate 600. In addition, a terminal region 310 connected to an external terminal such as a driver IC or FPC etc in the periphery of the display region 110 is arranged in each panel 700. The substrate 600 and opposing substrate 800 may also have flexibility respectively.

In addition, in the display device formation substrate of embodiment two, a seal member 810 is arranged between the display region 110 and terminal region 310 in the plurality of panels 700. In addition, a filling material 820 common to the plurality of panels 700 is arranged in a region enclosed by the seal member 810. In other words, the seal member 810 is arranged so as to enclose the display region 110 of the plurality of panels 700 and the filling material 820 is filled into the seal member 810. In addition, in other words, the filling material 820 is arranged so as to cover each display region 110 in common of the plurality of panels 700 and the seal member 810 is arranged in the periphery of the filling material 820. Here, it is preferred that a solid filling material is used for the filling material 820.

In adjacent panels 700 in the direction D1 in FIG. 12, each terminal region 310 is arranged mutually facing each other via the seal member 810 and filling material 820. In other words, in adjacent panels 700 in the direction D1, each terminal region 310 is arranged on the opposite side with respect to the filling material 820 which covers each display region 110 in common of each panel respectively. Furthermore, when the display device formation substrate shown in FIG. 12 is separated into each panel, it is possible to obtain the panel having the same structure as shown in FIG. 2.

(Problems in a Conventional Example)

Figure 25:
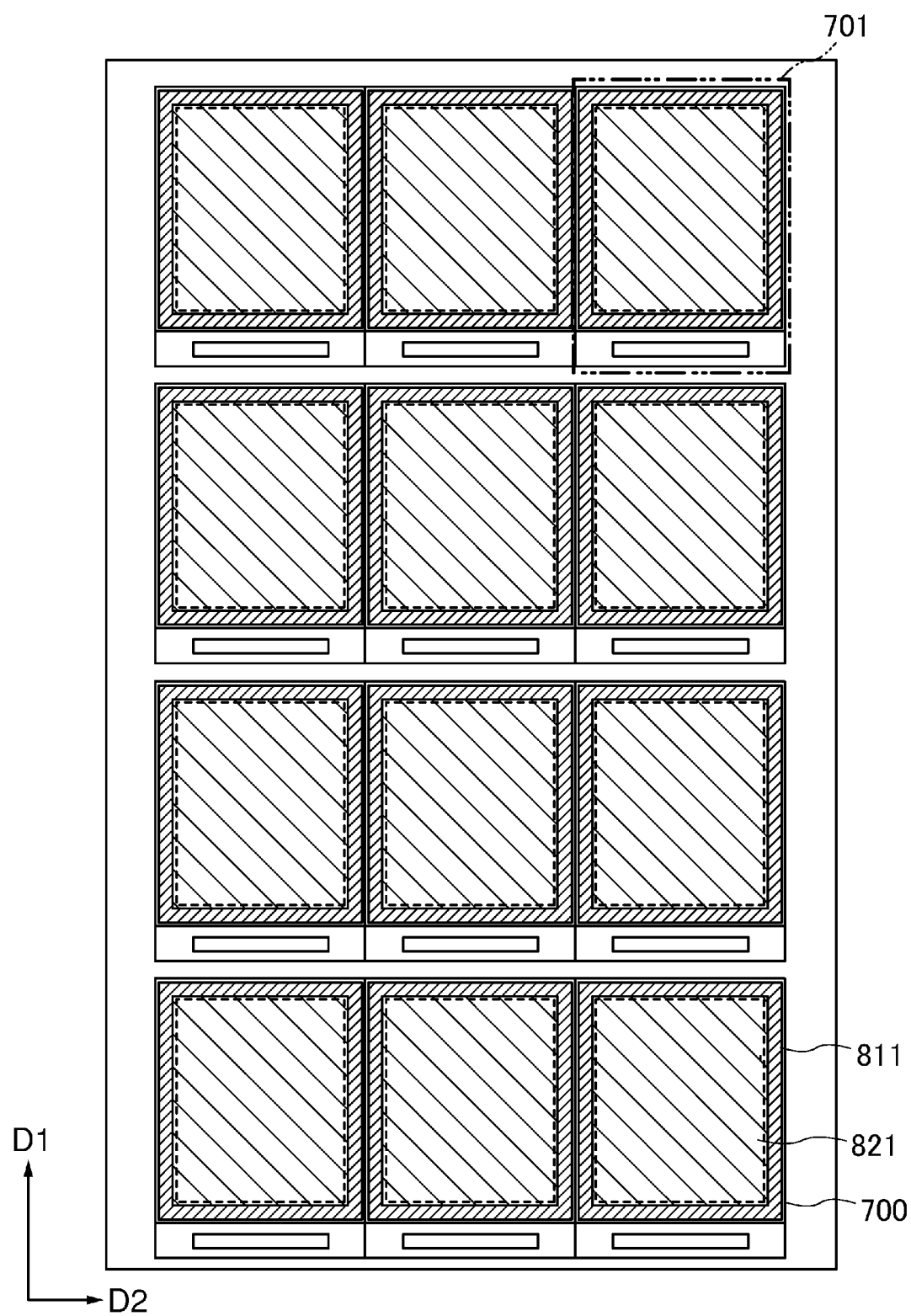
FIG. 25 is a diagram showing a planar view of a conventional display device formation substrate.

Here, the structure of a conventional display device formation substrate and its problems are explained using FIG. 25. FIG. 25 is a diagram showing a planar view of a conventional display device formation substrate. In a conventional display device formation substrate, the seal member 811 and filling material 821 are arranged individually with respect to each panel 701. As is shown in FIG. 25, when the seal member 811 and filling material 821 are arranged for each panel, because it is necessary to align each panel 700 in a coating process of a seal member and filling material, the processing time becomes very long. In addition, the amount of seal material used is large which increases costs.

Furthermore, when each panel is separated from the structure of the conventional display device formation substrate shown in FIG. 25, the panel structure shown in FIG. 23 is obtained. As described above, in the panel in FIG. 23, the substrate sometimes warps at the end part and a problem of peeling occurs between the substrate and seal material.

However, in the display device formation substrate including the characteristics shown in FIG. 12, because the seal member 810 and filling material 820 are formed in common with respect to the plurality of panels, it is possible to reduce processing time and improve takt time. In addition, because it is possible to significantly reduce the amount of seal member 810 that is used without significantly increasing the amount of filling material 820 which is used, it is possible to obtain the effect of a reduction in costs.

In addition, by not arranging a seal member on parts where the width of the periphery region is desired to be narrow, because of the structure shown in FIG. 2 when separated into each panel, it is possible to realize a narrow frame. In addition, it is possible to fix the end part of both substrates by extending the filling material from the display region to the end part of the substrate and opposing substrate after separating the panels. As a result, it is possible to control warping of both substrates and control the problem of peeling between the substrate and seal member.

Figure 14:
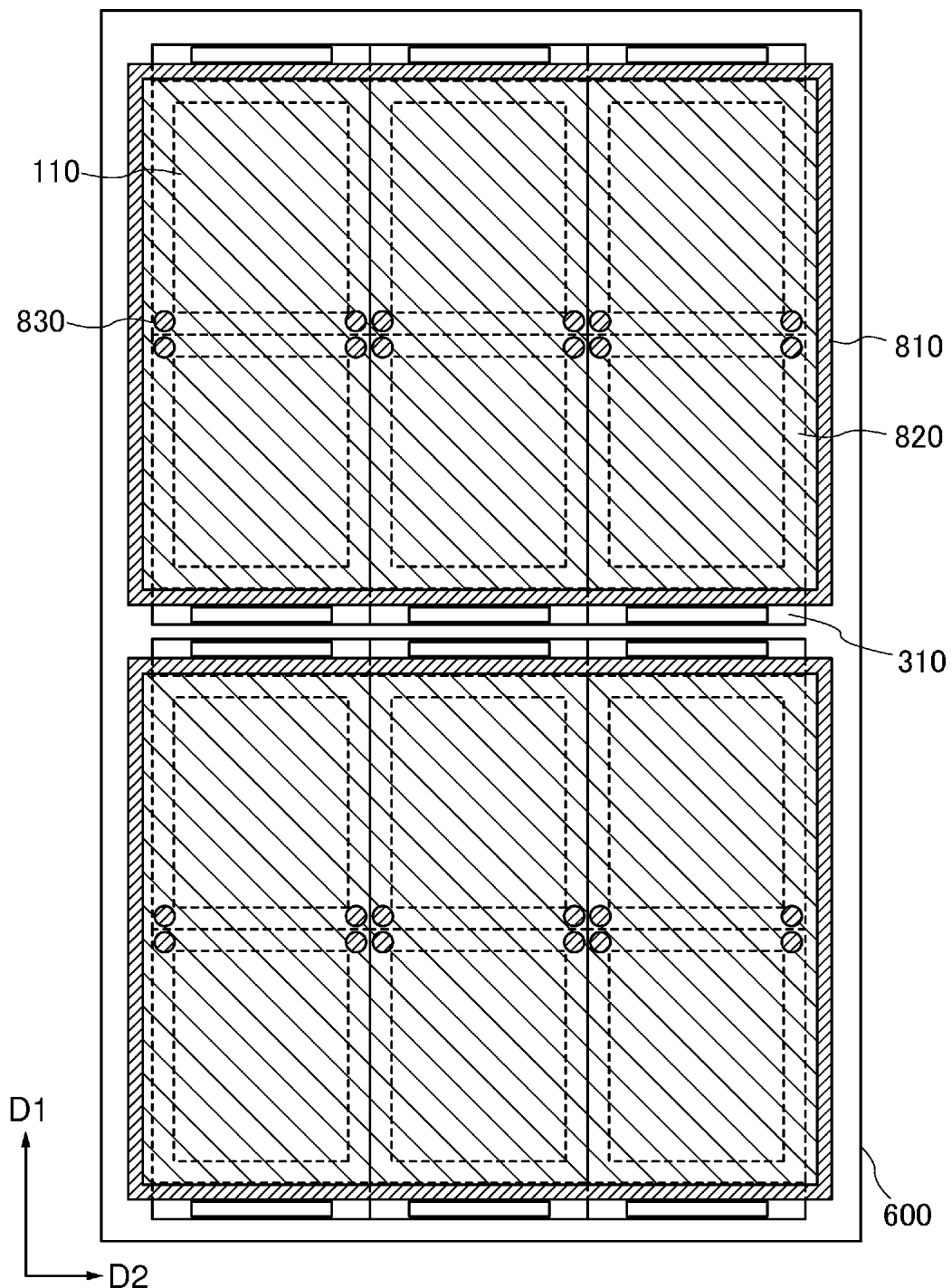
FIG. 14 is a diagram showing a planar view of the display device formation substrate in a modified example 1 of embodiment two of the present invention.
Figure 15:
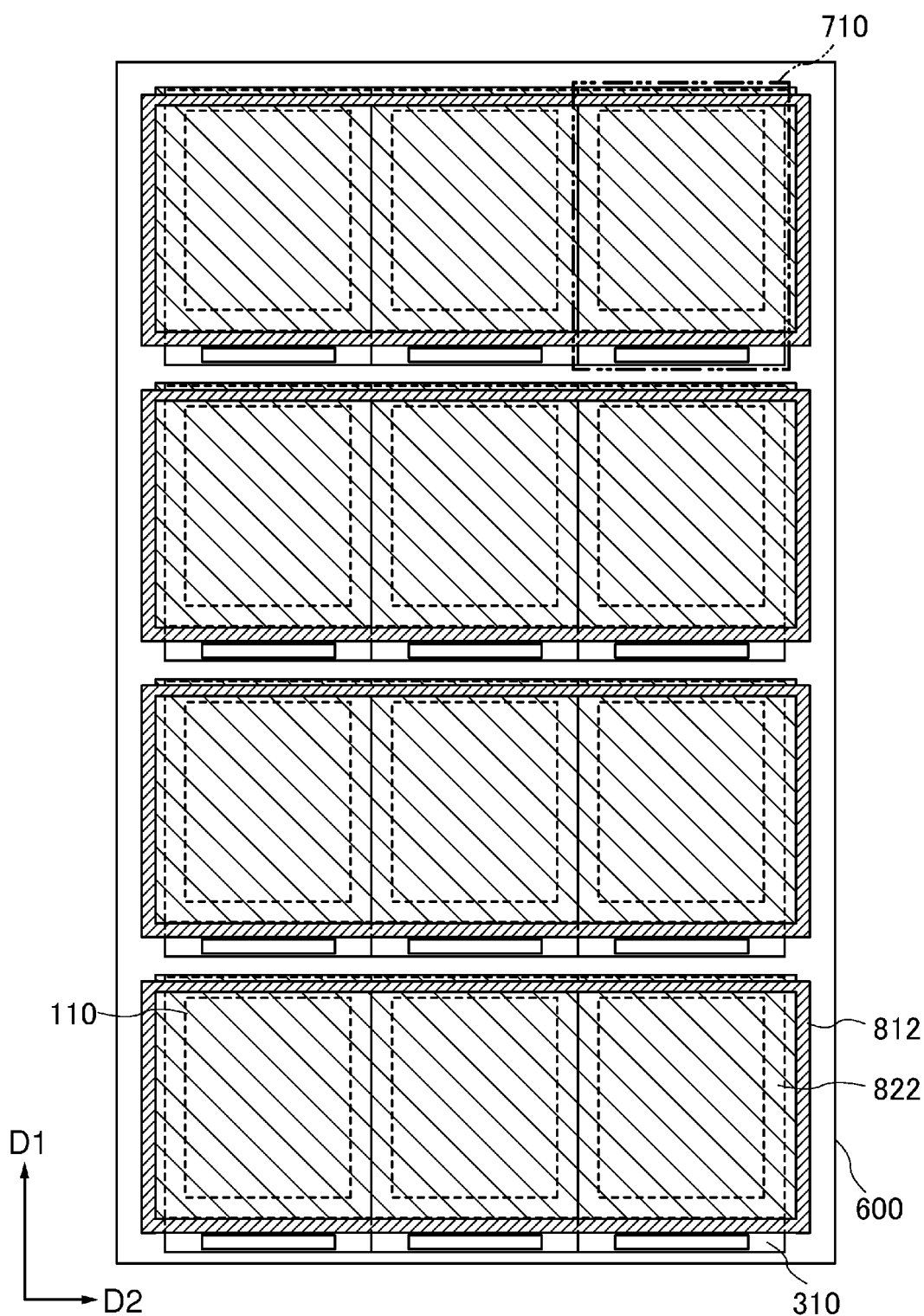
FIG. 15 is a diagram showing a planar view of the display device formation substrate in a modified example 2 of embodiment two of the present invention.
Figure 16:
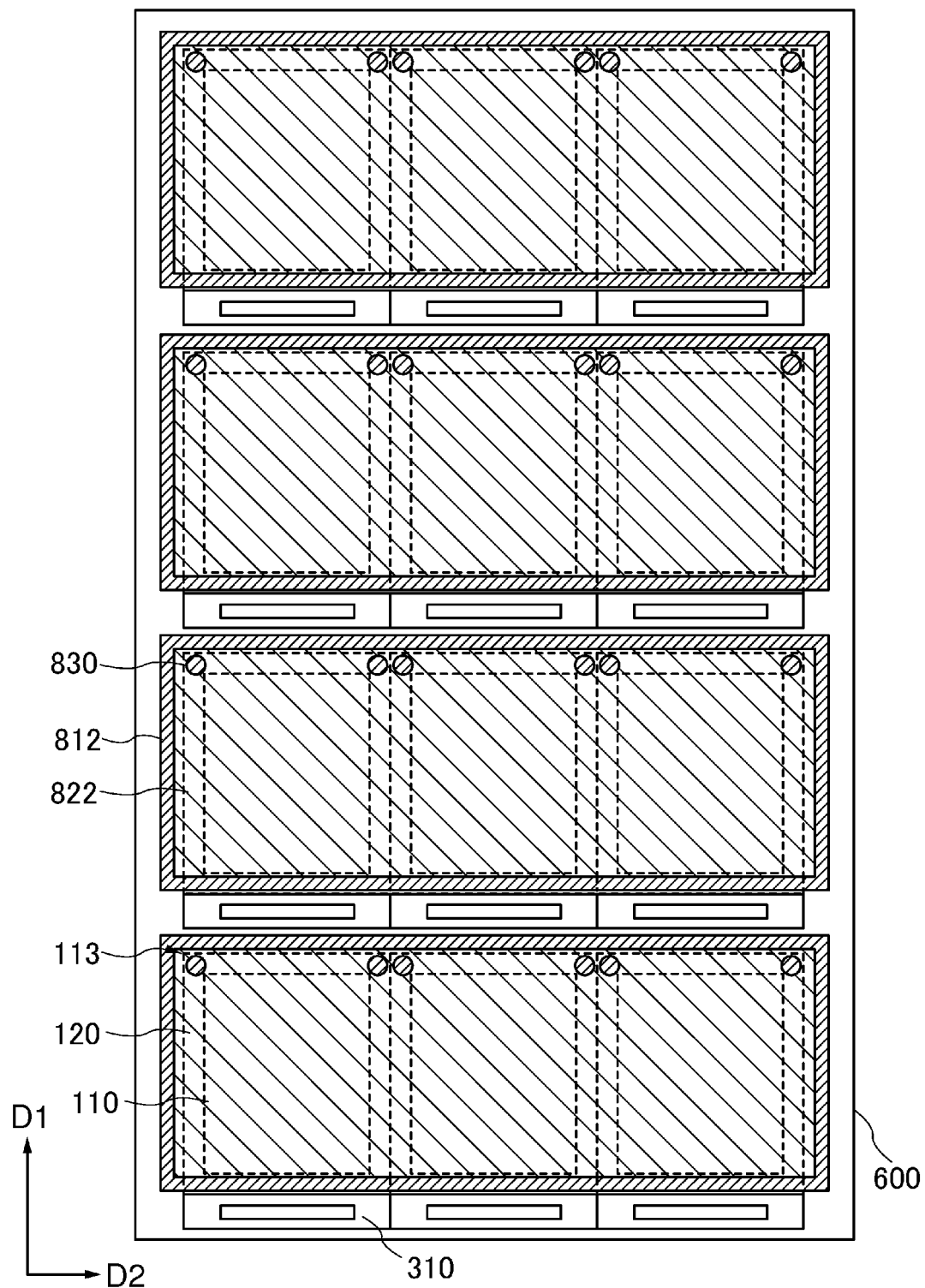
FIG. 16 is a diagram showing a planar view of the display device formation substrate in a modified example 3 of embodiment two of the present invention.

Next, a modified example of embodiment two is explained using FIG. 14 to FIG. 16. FIG. 14 is a diagram showing a planar view of the display device formation device of a modified example one of the embodiment two of the present invention. Although FIG. 14 is similar to FIG. 12, it is different in that a spacer 830 is arranged on a least one side different to the side in which the seal member 810 is arranged with respect to the display region 110 in each panel. In particular, in FIG. 14 the spacer 830 is arranged on the side opposite to the side on which the seal member 810 is arranged with respect to the a display region 110 in each panel. In other words, in FIG. 14, the spacer 830 is arranged in a region facing the seal member 810 via the display region 110 in each panel.

In FIG. 14, the spacer 830 is formed using the same material and same process as the seal member 810. That is, the space 830 also functions as a seal member. In addition, although a structure in which the spacer 830 is formed from the same material and same process as the seal member 810 in FIG. 14, the present invention is not limited to this structure. The spacer 830 may also be formed using a different material and different process from the seal member 810. For example, the spacer 830 may be formed by stacking all or a part of the layers which form the transistor layer 111 and light emitting element 112. In addition, the spacer 830 may also be formed by forming a resin layer, an inorganic layer or particles different to that of the seal component.

By using the structure shown in FIG. 14, it is possible to obtain the effects of an improvement in takt time and reduction in costs the same as the display device formation substrate shown in FIG. 12. In addition, because it is possible to obtain the structure shown in FIG. 7 when separating into each panel, it is possible to stably and uniformly support h distance between each substrate.

FIG. 15 is a diagram showing a planar view of a display device formation substrate of a modified example two of the present invention. FIG. 15 is different to FIG. 12 because the plurality of panels 710 arranged above the substrate 600 is all arranged in the same direction. In addition the seal member 812 is arranged between the display region 110 and terminal region 310 in the plurality of panels 710 in the direction D2. Furthermore, the seal member 812 is also arranged in a region facing the terminal region 310 via the display region 110 and periphery region 120. In other words, the seal member 812 is arranged so as to enclose the display region 110 of the plurality of panels 710, and the filling material 822 is filled into the seal member 812. In addition, in other words, the filling material 822 is arranged so as to cover each display panel 110 in common of the plurality of panels 710 and the seal member 812 is arranged in the periphery of the filling material 822. Furthermore, when the display device formation substrate shown in FIG. 15 is separated into each panel, a panel having the same structure as in FIG. 9 can be obtained.

By adopting the structure shown in FIG. 15, it is possible to obtain an improvement in takt time and a reduction in costs the same as the display device formation substrate shown in FIG. 12. In addition, because the structure shown in FIG. 9 is obtained when each panel is separated, it is possible to stably and uniformly support the distance between each substrate and strengthen adhesion between each substrate.

FIG. 16 is a diagram showing a planar view of a display device formation substrate of a modified example three of the present invention. FIG. 16 is different to FIG. 15 because a first end part 113 of the periphery region 120 facing the terminal region 310 via the display region 110 is covered by the filling material 822. In addition, FIG. 16 is different from FIG. 15 in that spacer 830 is arranged on at least one side different to the side on which the seal member 812 is arranged with respect to the display region 110. In particular, in FIG. 16, the spacer 830 is arranged on the side opposite the side on which the seal member 812 is arranged with respect to the display region 110. In other words, in FIG. 16, the spacer 830 is arranged in a region facing the seal member 812 via the display region 110.

By adopting the structure shown in FIG. 16 it is possible to o obtain an improvement in takt time and a reduction in costs the same as the display device formation substrate shown in FIG. 12. In addition, because the structure shown in FIG. 7 is obtained when each panel is separated, it is possible to stably and uniformly support the distance between each substrate.

As described above, according to the display device formation substrate of embodiment two, because it is possible to form a seal member and filling material in common with respect to a plurality of panels formed above a substrate, it is possible to reduce processing time and improve takt time. In addition, it is possible to reduce the amount of sea member used without significantly increasing the amount of filling material used and therefore achieve a reduction in costs.

(Embodiment Three)

Figure 17:
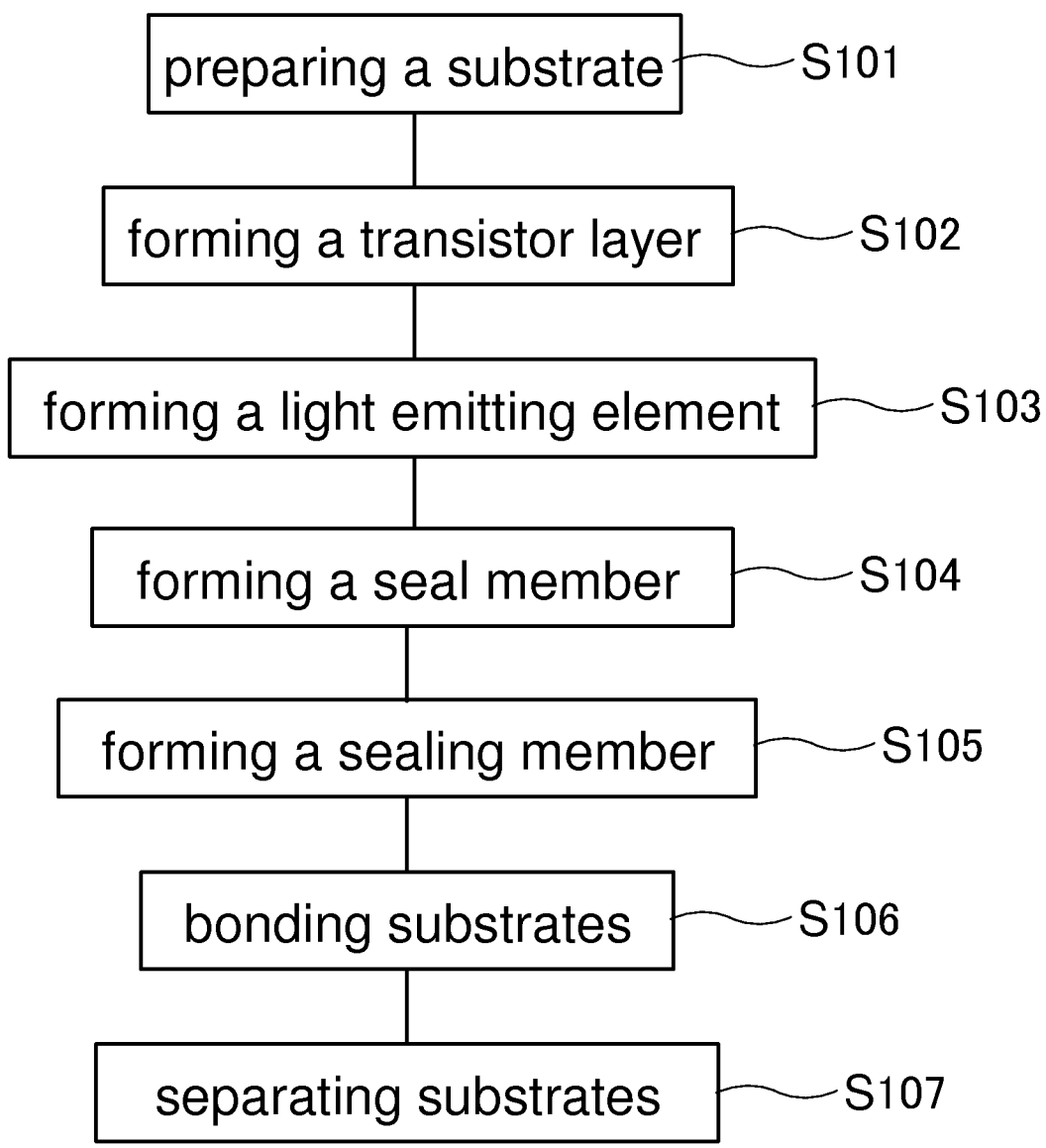
FIG. 17 is a diagram showing a summary of a manufacturing method of a display device in embodiment three of the present invention.

A manufacturing method of a display device of embodiment three of the present invention is explained using FIG. 17 to FIG. 22. FIG. 17 is a diagram showing a schematic of a manufacturing method in embodiment three of the present invention. In addition, FIG. 18 to FIG. 22 are cross-sectional diagrams showing each process in the manufacturing method of the display device in embodiment three of the present invention. The cross-sectional diagrams shown in FIG. 18 to FIG. 22 correspond to the cross-sectional diagram of line G-H in FIG. 12. Subsequently, a process flow of the display device in embodiment three is explained in detail using FIG. 17 and FIG. 18 to FIG. 22.

Figure 18:
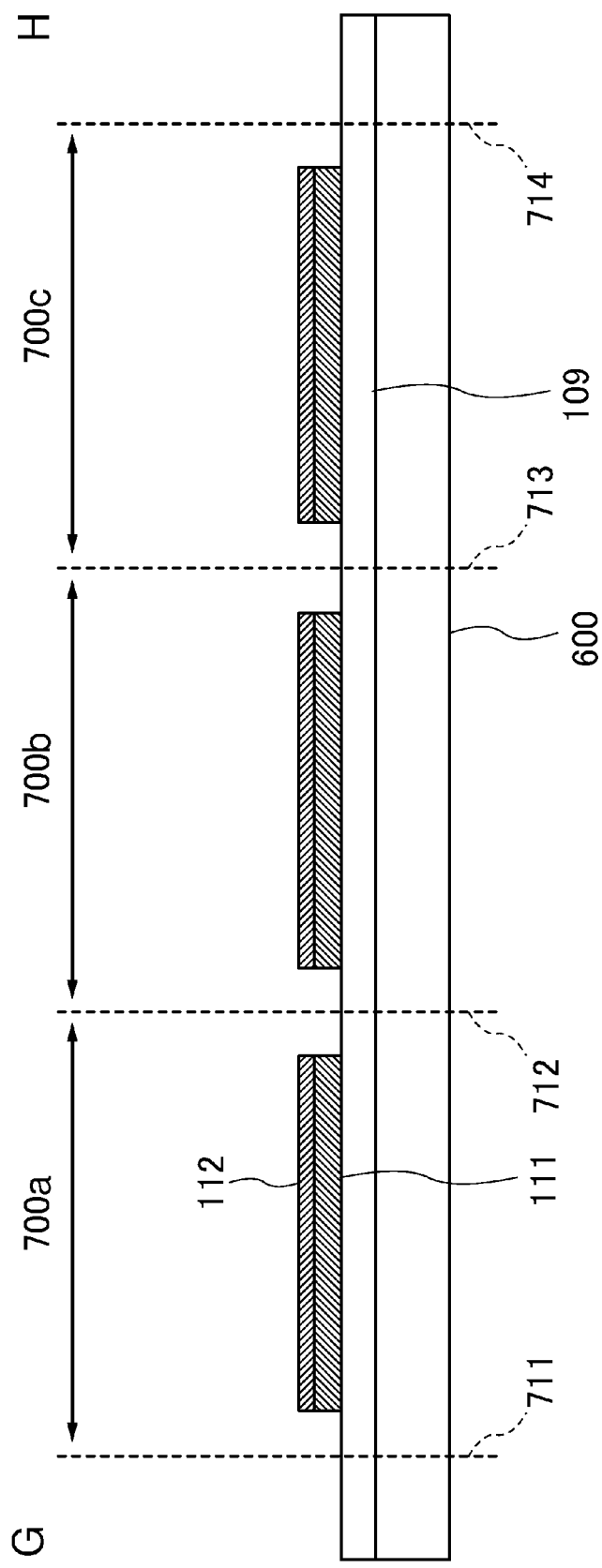
FIG. 18 is a cross-sectional diagram showing a process for forming a transistor layer and a light emitting element in the manufacturing method of the display device in embodiment three of the present invention.

First, a substrate 600 is prepared (S101) and above this a transistor layer 111 is formed via a ground layer 109 (S102). Next, a light emitting element 112 is formed via an interlayer film above the transistor layer 111 (S103). FIG. 18 is a cross-sectional diagram showing the processes of forming a transistor layer and light emitting element in a manufacturing method of a display device in embodiment three of the present invention. Here, 700a, 700b and 700c correspond to one panel respectively, and each panel is cut along the dotted line 711 to 714 in a panel separation process explained below. Here, a protective film which covers the transistor layer 111 and light emitting element 112 may be further included. The substrate 600 and an opposing substrate may have flexibility.

It is possible to use a general structure as the transistor formed in the transistor layer 111, for example, it is possible to use a bottom gate type transistor or top gate type transistor. The light emitting element 112 may also be a white light emitting element obtained by stacking light emitting layers which emit light at different wave lengths. In addition, the light emitting element may also be a single color light emitter emitting light with the wave length of either R (red), G (green) or B (blue).

Figure 19:
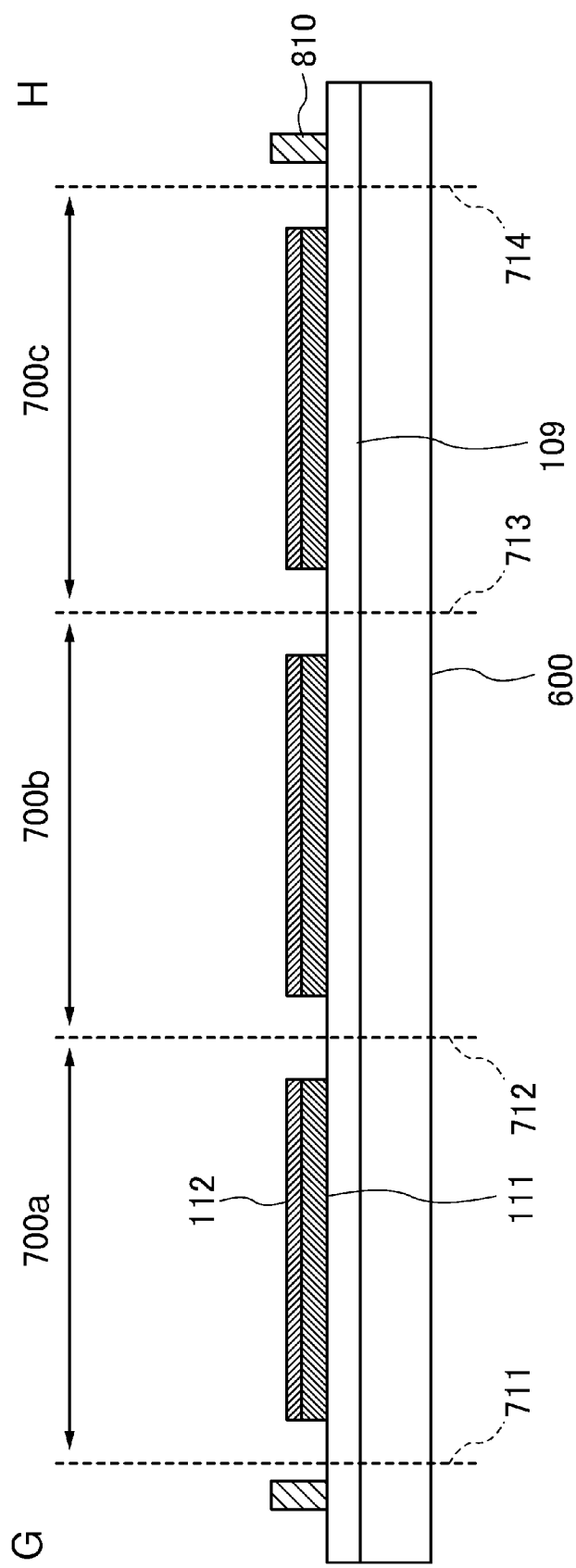
FIG. 19 is a cross-sectional diagram showing a process for forming a seal member in the manufacturing method of the display device in embodiment three of the present invention.

Next, a seal member 810 is formed to enclose at least the panel 700a, 700b and 700c (S104). FIG. 19 is a cross-sectional diagram showing a process for forming a seal member in a manufacturing method of the display device in embodiment three of the present invention. The seal member 810 is arranged further to the outside than the end part of the panel 700a and 700c in the direction G-H. The seal member 810 can be formed by a coating method, for example by using a dipping method or inkjet method. In addition, a glass frit may also be used as the seal member. The glass frit is a glass material with a comparatively low melting point temperature between 300~700° C. having various forms such as a powder or paste.

Figure 20:
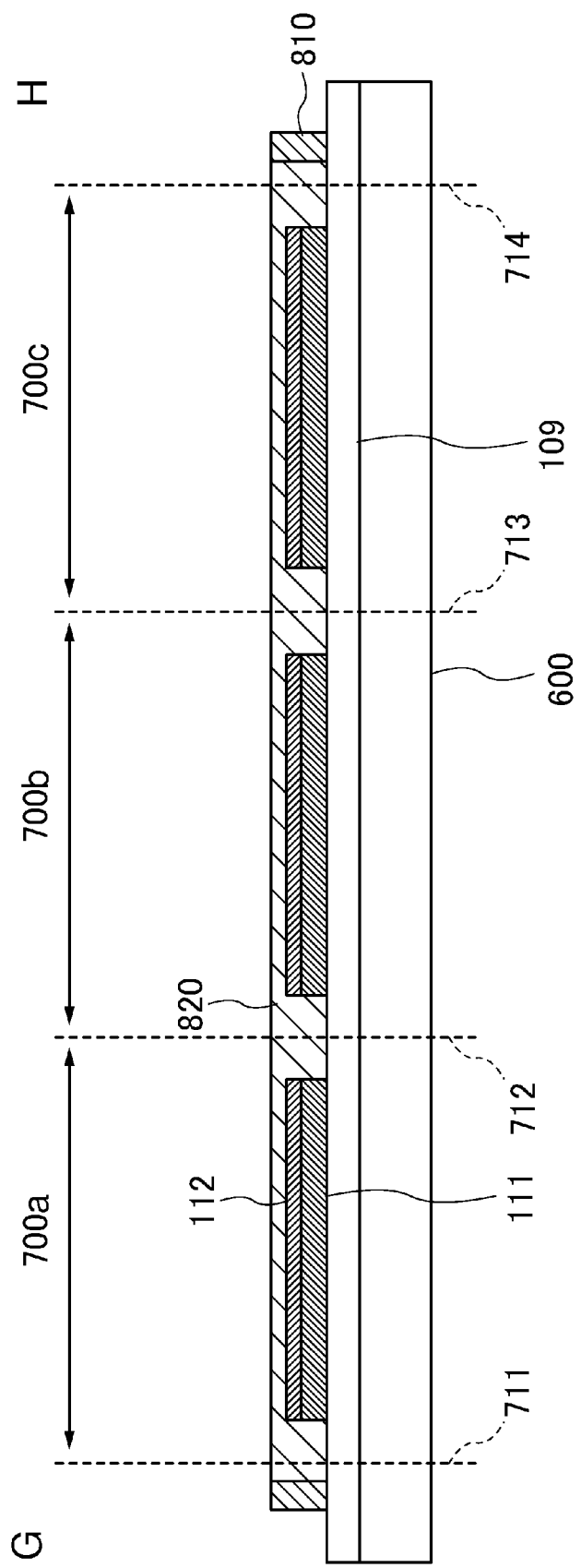
FIG. 20 is a cross-sectional diagram showing a process for forming a filling material in the manufacturing method of the display device in embodiment three of the present invention.

Next, the filling material 820 is formed so as to cover the transistor layer 111 and light emitting element 112 in an internal region of the seal member 810 (S105). FIG. 20 is a cross-sectional diagram showing the process of forming a filling material in a manufacturing method of the display device in embodiment three of the present invention. As described above, because the seal member 810 is arranged further to the outside than the end parts of the panels 700a, 700b and 700c in the direction G-H, it is possible to form the filling material 820 up to the end parts of the panels 700a, 700b and 700c. Here, it is preferred to use as solid filling material as the filling material 820.

Figure 21:
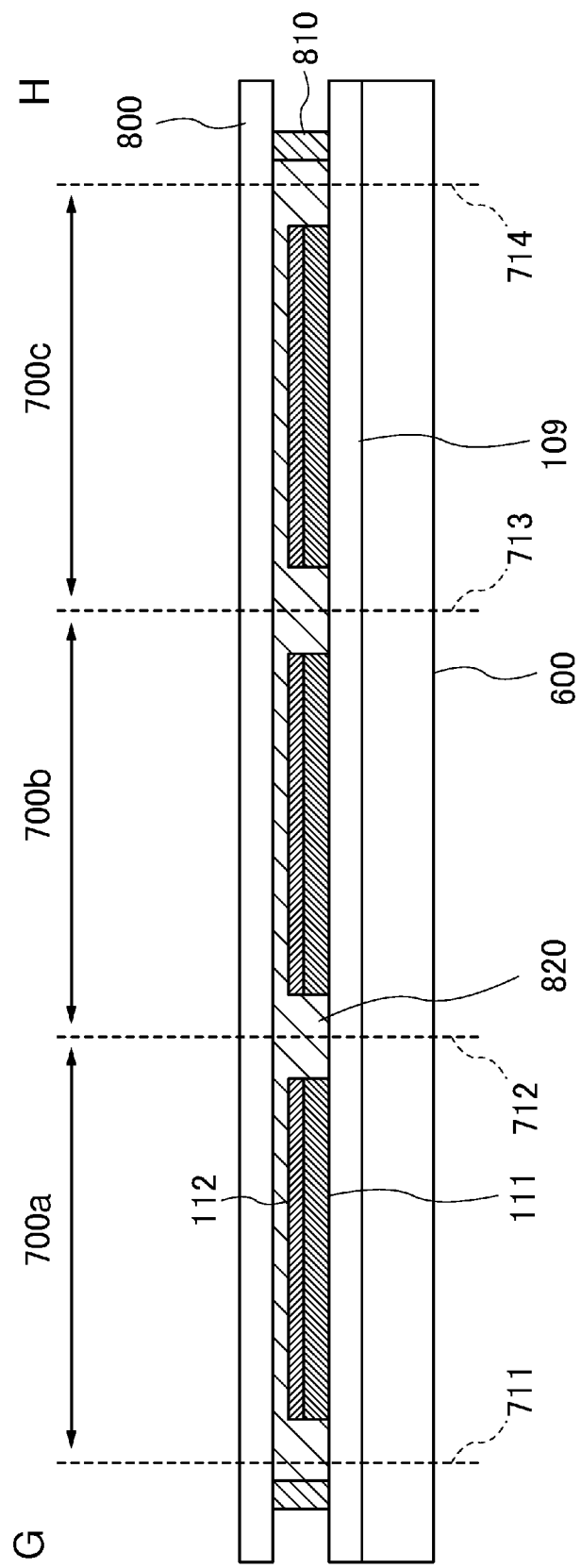
FIG. 21 is a cross-sectional diagram showing a process for bonding a substrate and an opposing substrate in the manufacturing method of the display device in embodiment three of the present invention.

Next, the substrate 600 and opposing substrate 800 are bonded together via the seal member 810 and filling material 820 (S106). FIG. 21 is a cross-sectional diagram showing the process of bonding a substrate and opposing substrate in the manufacturing method of the display device in embodiment three of the present invention. FIG. 21 is essentially the same as FIG. 13. Here, the opposing substrate 800 which is bonded to the substrate 600 may be the same size as the substrate 600 and may also be a size adjusted so as to conform with the size of the seal member 810.

Figure 22:
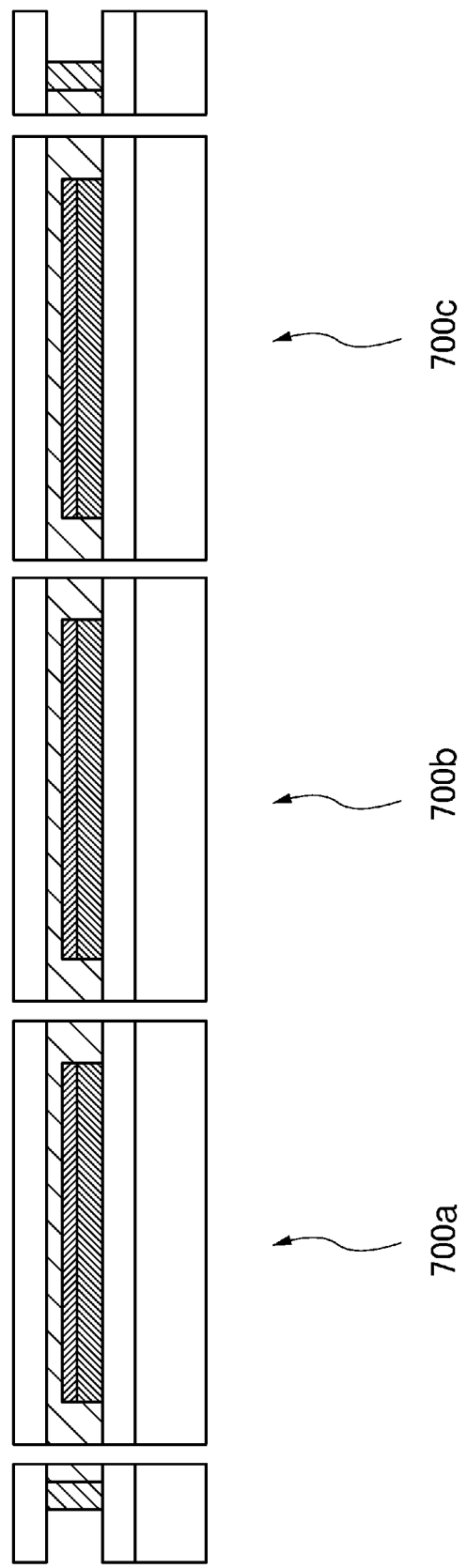
FIG. 22 is a cross-sectional diagram showing a process for separating a substrate for each panel in the manufacturing method of the display device in embodiment three of the present invention.

Next, each panel is separated by separating the substrate 600 and opposing substrate 800 (S107). Separation of a substrate may be performed using a mechanical cutter such as a dicer or by using a laser scribe. As is shown in FIG. 22, each panel prepared using the manufactured method described above is obtained essentially the same as the panel obtained in FIG. 3.

As described above, according to the manufacturing method of the display device of embodiment three, because it is possible to form a seal member and filling material in common with a plurality of panels as shown in FIG. 12, it is possible to reduce processing time and improve takt time. In addition, it is possible to reduce the amount of seal member that is used and obtain the effect of a reduction in costs.

Furthermore, a panel after separation can realize a narrow frame by not arranging a seal member on parts where the width of the periphery region is desired to be narrow as shown in FIG. 3. In addition, it is possible to fix the end parts of two substrates by extending a filling material from a display region up to the end parts of a substrate and opposing substrate after panel separation. As a result, it is possible to control warping of both substrates and control the problem of peeling between a substrate and seal member.

Furthermore, the present invention is not limited to the embodiments described above and may be appropriately modified without departing from the scope of the invention.

What is claimed is:

1. A display device comprising:
   a first flexible substrate having a first surface, wherein the first surface has a first edge, a second edge, a third edge, and a fourth edge, wherein the first edge and the third edge are in parallel, and the second edge and the fourth edge are in parallel;
   a second flexible substrate having a second surface facing the first surface, wherein the second surface has a fifth edge, a sixth edge, a seventh edge, and an eighth edge, and arranged facing the first flexible substrate, wherein the fifth edge and the seventh edge are in parallel, and the sixth edge and the eight edge are in parallel;
   a light emitting element arranged in a display region of the first flexible substrate;
   a filling material covering the light emitting element and continuously extending from the display region to at least a part of a first outermost edge of the first edge, a second outermost edge of the second edge, and a third outermost edge of the third edge of the first flexible substrate and to at least a part of a fifth outermost edge of the fifth edge, a sixth outermost edge of the sixth edge, and a seventh outermost edge of the seventh edge of the second flexible substrate; and
   a first seal member extending from the first outermost edge and the fifth outermost edge to the third outermost edge and the seventh outermost edge between the display region and a terminal region exposing the first flexible substrate from the second flexible substrate and connecting an external terminal,
   a spacer arranged between the first flexible substrate and the second flexible substrate, the spacer being arranged in a region facing the first seal member via the display region, wherein
   the spacer is not connected with the first seal member; and
   the filling material is arranged between the spacer and at least one of the first outermost edge, the second outermost edge, third outermost edge, fifth outermost edge, sixth outermost edge, and seventh outermost edge.

2. The display device according to claim 1, wherein the filling material is a solid.

3. The display device according to claim 1, wherein an end part of the filling material is positioned between the first substrate and second substrate, and the first seal member.

4. The display device according to claim 1, wherein the spacer is a second seal member.

5. The display device according to claim 4, wherein a slit is arranged in the second seal member.

6. The display device according to claim 1, wherein
the first edge faces the fifth edge,
the third edge faces the seventh edge,
the filling material provided between the first edge and the fifth edge is recessed toward the display region to form a concave shape in a cross-sectional view, and
the filing material provided between the third edge and the seventh edge is recessed toward the display region to form a concave shape in a cross-sectional view.

7. A display device formation substrate comprising:
a substrate arranged with a plurality of panels including a first panel and a second panel adjacent to the first panel, wherein each of the first panel and the second panel comprises;
  a first substrate having a first surface, wherein the first surface has a first edge, a second edge, a third edge, and a fourth edge, wherein the first edge and the third edge are in parallel, and the second edge and the fourth edge are in parallel;
  a second substrate having a second surface facing the first surface, wherein the second surface has a fifth edge, a sixth edge, a seventh edge, and an eighth edge, and arranged facing the first flexible substrate, wherein the fifth edge and the seventh edge are in parallel, and the sixth edge and the eight edge are in parallel;
  a light emitting element arranged in a display region of the first substrate;
  a seal member extending from a first outermost edge of the first edge and a fifth outermost edge of the fifth edge of the first substrate to a third outermost edge of the third edge and a seventh outermost edge of the seventh edge of the second substrate between the display region of the plurality of panels and a terminal region of the plurality of panels positioned on a periphery of the display region, the terminal region being connected to an external terminal; and
  a filling member arranged in a region enclosed by the seal member,
  wherein the filling member extends from the first panel to the second panel, covers the light emitting element, and continuously extends from the display region to at least a part of the first outermost edge, the third outermost edge and a second outermost edge of the second edge and to at least a part of the fifth outermost edge, the seventh outermost edge and a sixth outermost edge of the sixth edge and a material of the filling member is different from that of the seal member;
  a spacer arranged between the first substrate and the second substrate, the spacer being arranged in a region facing the first seal member via the display region, wherein
the spacer is not connected with the first seal member; and
the filling material is arranged between the spacer and at least one of the first outermost edge, the second outermost edge, third outermost edge, fifth outermost edge, sixth outermost edge, and seventh outermost edge.

8. The display device formation substrate according to claim 7, wherein the each of the terminal regions of adjacent panels is arranged in mutually facing regions via the seal member.

9. The display device formation substrate according to claim 7, wherein the seal member is arranged in a region facing the terminal region via the display region in each of the plurality of panels.

* * * * *